(12) United States Patent
Middlebrooks et al.

(10) Patent No.: US 12,271,114 B2
(45) Date of Patent: Apr. 8, 2025

(54) METHOD AND APPARATUS FOR PREDICTING SUBSTRATE IMAGE

(71) Applicant: ASML NETHERLANDS B.V., Veldhoven (NL)

(72) Inventors: Scott Anderson Middlebrooks, Duizel (NL); Adrianus Cornelis Matheus Koopman, Hilversum (NL); Markus Gerardus Martinus Maria Van Kraaij, Eindhoven (NL); Maxim Pisarenco, Son en Breugel (NL); Stefan Hunsche, Santa Clara, CA (US)

(73) Assignee: ASML NETHERLANDS B.V., Veldhoven (NL)

( * ) Notice: Subject to any disclaimer, the term of this patent is extended or adjusted under 35 U.S.C. 154(b) by 869 days.

(21) Appl. No.: 17/441,729

(22) PCT Filed: Mar. 26, 2020

(86) PCT No.: PCT/EP2020/058488
§ 371 (c)(1),
(2) Date: Sep. 22, 2021

(87) PCT Pub. No.: WO2020/200993
PCT Pub. Date: Oct. 8, 2020

(65) Prior Publication Data
US 2022/0187713 A1 Jun. 16, 2022

Related U.S. Application Data

(60) Provisional application No. 62/829,270, filed on Apr. 4, 2019.

(51) Int. Cl.
*G03F 7/00* (2006.01)
*G06N 3/08* (2023.01)
*G06T 7/00* (2017.01)

(52) U.S. Cl.
CPC .......... *G03F 7/705* (2013.01); *G03F 7/70616* (2013.01); *G06N 3/08* (2013.01);
(Continued)

(58) Field of Classification Search
CPC ....... G03F 7/705; G03F 7/70616; G06N 3/08; G03T 7/0006
See application file for complete search history.

(56) References Cited

U.S. PATENT DOCUMENTS

| 5,229,872 A | 7/1993 | Mumola |
| 5,296,891 A | 3/1994 | Vogt et al. |

(Continued)

FOREIGN PATENT DOCUMENTS

| CN | 105814491 | 7/2016 |
| CN | 107924132 | 4/2018 |

(Continued)

OTHER PUBLICATIONS

Yumiba, Ryo, et al. "Deep learning's impact on contour extraction for design based metrology and design based inspection." Metrology, Inspection, and Process Control for Microlithography XXXIII. vol. 10959. SPIE, 2019.*

(Continued)

*Primary Examiner* — Benjamin P Geib
(74) *Attorney, Agent, or Firm* — Pillsbury Winthrop Shaw Pittman LLP

(57) ABSTRACT

A method for training a machine learning model configured to predict a substrate image corresponding to a printed pattern of a substrate as measured via a metrology tool. The method involves obtaining a training data set including (i) metrology data of the metrology tool used to measure the printed pattern of the substrate, and (ii) a representation of a mask pattern employed for imaging the printed pattern on the substrate; and training, based on the training data set, a (Continued)

machine learning model to predict the substrate image of the substrate as measured by the metrology tool such that a cost function is improved, wherein the cost function includes a relationship between the predicted substrate image and the metrology data.

20 Claims, 17 Drawing Sheets

(52) U.S. Cl.
CPC .. *G06T 7/0006* (2013.01); *G06T 2207/10061* (2013.01); *G06T 2207/20081* (2013.01); *G06T 2207/20084* (2013.01); *G06T 2207/30148* (2013.01)

(56) References Cited

U.S. PATENT DOCUMENTS

| | | | |
|---|---|---|---|
| 5,523,193 | A | 6/1996 | Nelson |
| 5,969,441 | A | 10/1999 | Loopstra et al. |
| 6,046,792 | A | 4/2000 | Van Der Werf et al. |
| 9,632,039 | B2 | 4/2017 | Den Boef et al. |
| 10,761,432 | B2 | 9/2020 | Mathijssen et al. |
| 2010/0017778 | A1 | 1/2010 | Futrell et al. |

FOREIGN PATENT DOCUMENTS

| | | | | |
|---|---|---|---|---|
| CN | 108228981 | | 6/2018 | |
| KR | 10-2006-0033470 | | 4/2006 | |
| WO | 2018108528 | | 6/2018 | |
| WO | 2018125220 | | 7/2018 | |
| WO | WO-2018125220 | A1 * | 7/2018 | |
| WO | 2018153866 | | 8/2018 | |
| WO | WO-2018153866 | A1 * | 8/2018 | ......... G03F 7/70125 |
| WO | 2019162204 | | 8/2019 | |

OTHER PUBLICATIONS

International Search Report and Written Opinion issued in corresponding PCT Patent Application No. PCT/EP2020/058488, dated Aug. 3, 2020.
Yumiba, Ryo et al.: "Deep learning's impact on contour extraction for design based metrology and design based inspection", Proc. of SPIE, vol. 10959 (Mar. 26, 2019).
Shao, H-C et al.: "From IC Layout to Die Photo: A CNN-Based Data-Driven Approach", arXiv:2002.04967 [eess.IV], https://arxiv.org/abs/2002.04967 (accessed on Sep. 21, 2021) (2020).
Office Action issued in corresponding Chinese Patent Application No. 202080026837, dated Jul. 3, 2024.
Office Action issued in Korean Patent Application No. 10-2021-7031881, dated Oct. 6, 2023.
Office Action issued in corresponding Chinese Patent Application No. 202080026837.7, dated Dec. 1, 2023.

* cited by examiner

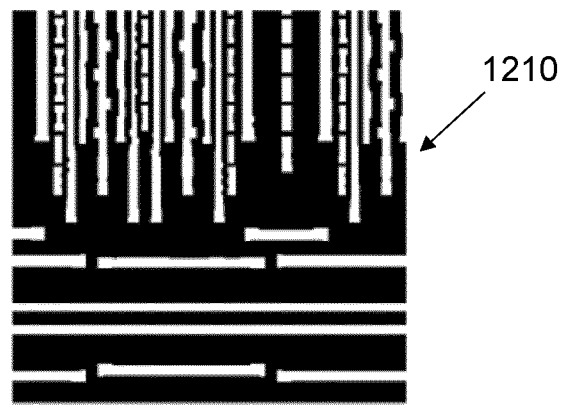
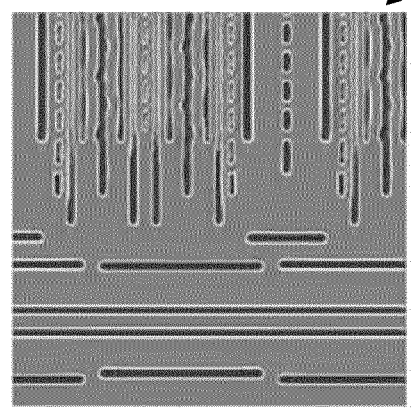
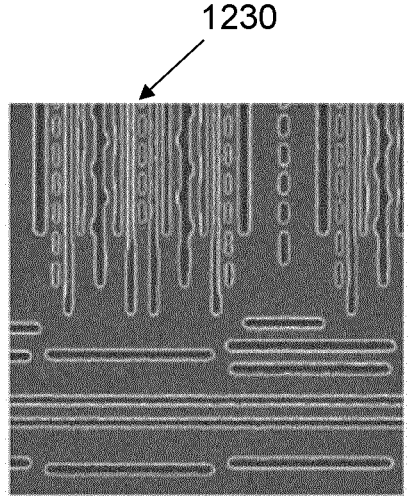
FIG. 12A               FIG. 12B

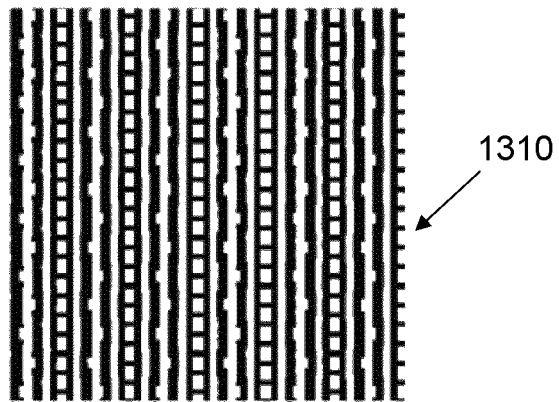
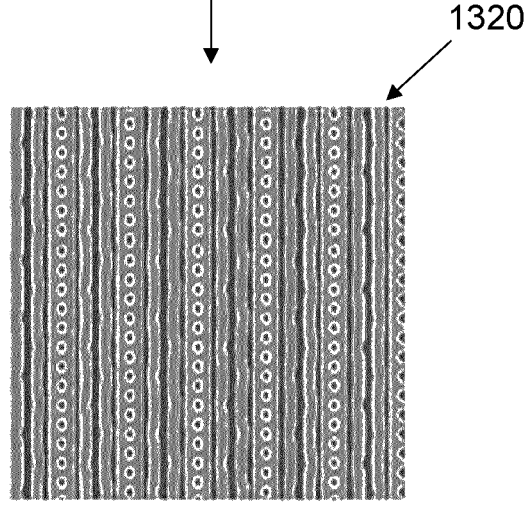
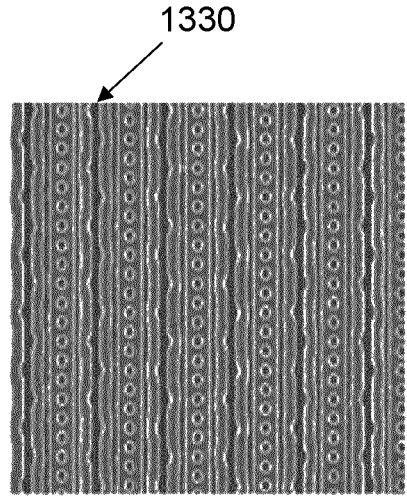
FIG. 13A
FIG. 13B

METHOD AND APPARATUS FOR
PREDICTING SUBSTRATE IMAGE

CROSS-REFERENCE TO RELATED APPLICATIONS

This application is the U.S. national phase entry of PCT Patent Application No. PCT/EP2020/058488, which was filed on Mach 26, 2020, which claims the benefit of priority of U.S. Patent Application No. 62/829,270, which was filed on Apr. 4, 2019, and which is incorporated herein in its entirety by reference.

FIELD

The present description relates to methods and apparatus for detection, registration and high-resolution quantification of images corresponding to a printed substrate subjected to a patterning process.

BACKGROUND

A lithography apparatus is a machine that applies a desired pattern onto a target portion of a substrate. Lithography apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithography apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti parallel to this direction. Different portions of the circuit pattern on the patterning device are transferred to one target portion progressively. Since, in general, the lithographic projection apparatus will have a magnification factor M (generally <1), the speed F at which the substrate is moved will be a factor M times that at which the projection beam scans the patterning device. More information with regard to lithographic devices as described herein can be gleaned, for example, from U.S. Pat. No. 6,046,792, incorporated herein by reference.

Prior to transferring the circuit pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred circuit pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

As noted, microlithography is a central step in the manufacturing of ICs, where patterns formed on substrates define functional elements of the ICs, such as microprocessors, memory chips etc. Similar lithographic techniques are also used in the formation of flat panel displays, micro-electro mechanical systems (MEMS) and other devices.

As semiconductor manufacturing processes continue to advance, the dimensions of functional elements have continually been reduced while the amount of functional elements, such as transistors, per device has been steadily increasing over decades, following a trend commonly referred to as "Moore's law". At the current state of technology, layers of devices are manufactured using lithographic projection apparatuses that project a design layout onto a substrate using illumination from a deep-ultraviolet illumination source, creating individual functional elements having dimensions well below 100 nm, i.e. less than half the wavelength of the radiation from the illumination source (e.g., a 193 nm illumination source).

This process in which features with dimensions smaller than the classical resolution limit of a lithographic projection apparatus are printed, is commonly known as low-k1 lithography, according to the resolution formula $CD=k_1\times\lambda/NA$, where $\lambda$ is the wavelength of radiation employed (currently in most cases 248 nm or 193 nm), NA is the numerical aperture of projection optics in the lithographic projection apparatus, CD is the "critical dimension"—generally the smallest feature size printed—and k1 is an empirical resolution factor. In general, the smaller k1 the more difficult it becomes to reproduce a pattern on the substrate that resembles the shape and dimensions planned by a circuit designer in order to achieve particular electrical functionality and performance. To overcome these difficulties, sophisticated fine-tuning steps are applied to the lithographic projection apparatus and/or design layout. These include, for example, but not limited to, optimization of NA and optical coherence settings, customized illumination schemes, use of phase shifting patterning devices, optical proximity correction (OPC, sometimes also referred to as "optical and process correction") in the design layout, or other methods generally defined as "resolution enhancement techniques" (RET). The term "projection optics" as used herein should be broadly interpreted as encompassing various types of optical systems, including refractive optics, reflective optics, apertures and catadioptric optics, for example. The term "projection optics" may also include components operating according to any of these design types for directing, shaping or controlling the projection beam of radiation, collectively or singularly. The term "projection optics" may include any optical component in the lithographic projection apparatus, no matter where the optical component is located on an optical path of the lithographic projection apparatus. Projection optics may include optical components for shaping, adjusting and/or projecting radiation from the source before the radiation passes the patterning device, and/or optical components for shaping, adjusting and/or projecting the radiation after the radiation passes the patterning device. The projection optics generally exclude the source and the patterning device.

SUMMARY

In patterning processes, it is desirable to frequently make measurements of the structures created, e.g., for process control and verification. One or more parameters of the structures are typically measured or determined, for example the critical dimension of a structure, the overlay error between successive layers formed in or on the substrate, etc. There are various techniques for making measurements of the microscopic structures formed in a patterning process. Various tools for making such measurements are known including, but not limited to, scanning electron microscopes (SEMs), which are often used to measure critical dimension (CD).

To enable, for example, improved model identification, defect detection, process control, etc., it is desirable to provide a technique to process one or more images of one or more structures created using a patterning process and arrive at a model that predicts a resulting pattern (e.g., post-development, post-etch, etc.) from a design pattern used in the patterning process.

In an embodiment, there is provided a method for training a machine learning model configured to predict a substrate image corresponding to a printed pattern of a substrate as measured via a metrology tool. The method includes obtaining a training data set comprising (i) metrology data of the metrology tool used to measure the printed pattern of the substrate, and (ii) a mask pattern employed for imaging the printed pattern on the substrate; and training, based on the training data set, a machine learning model to predict the substrate image of the substrate as measured by the metrology tool such that a cost function is improved, where the cost function comprises a relationship between the predicted substrate image and the metrology data.

Furthermore, there is provided a method to predict a substrate image corresponding to a printed pattern of a substrate. The method includes obtaining a mask pattern of a patterning process, and the trained machine learning model; and predicting, via the trained machine learning model using the mask pattern as input, the substrate image that will be measured by the metrology tool.

Furthermore, there is provided a computer program product comprising a non-transitory computer readable medium having instructions recorded thereon, the instructions when executed by a computer implementing the method of any of the above claims.

BRIEF DESCRIPTION OF THE DRAWINGS

Embodiments will now be described, by way of example only, with reference to the accompanying drawings in which:

FIG. 12A illustrates an application of the trained machine learning model using a first mask pattern, according to an embodiment;

FIG. 12B is SEM image of an actual printed pattern imaged using the mask pattern illustrated in FIG. 12A, according to an embodiment;

FIG. 13A illustrates an application of the trained machine learning model using a second mask pattern, according to an embodiment;

FIG. 13B is SEM image of an actual printed pattern imaged using the mask pattern illustrated in FIG. 13A, according to an embodiment;

Embodiments will now be described in detail with reference to the drawings, which are provided as illustrative examples so as to enable those skilled in the art to practice the embodiments. Notably, the figures and examples below are not meant to limit the scope to a single embodiment, but other embodiments are possible by way of interchange of some or all of the described or illustrated elements. Wherever convenient, the same reference numbers will be used throughout the drawings to refer to same or like parts. Where certain elements of these embodiments can be partially or fully implemented using known components, only those portions of such known components that are necessary for an understanding of the embodiments will be described, and detailed descriptions of other portions of such known components will be omitted so as not to obscure the description of the embodiments. In the present specification, an embodiment showing a singular component should not be considered limiting; rather, the scope is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the scope encompasses present and future known equivalents to the components referred to herein by way of illustration.

DETAILED DESCRIPTION

Before describing embodiments in detail, it is instructive to present an example environment in which embodiments may be implemented.

Figure 1:
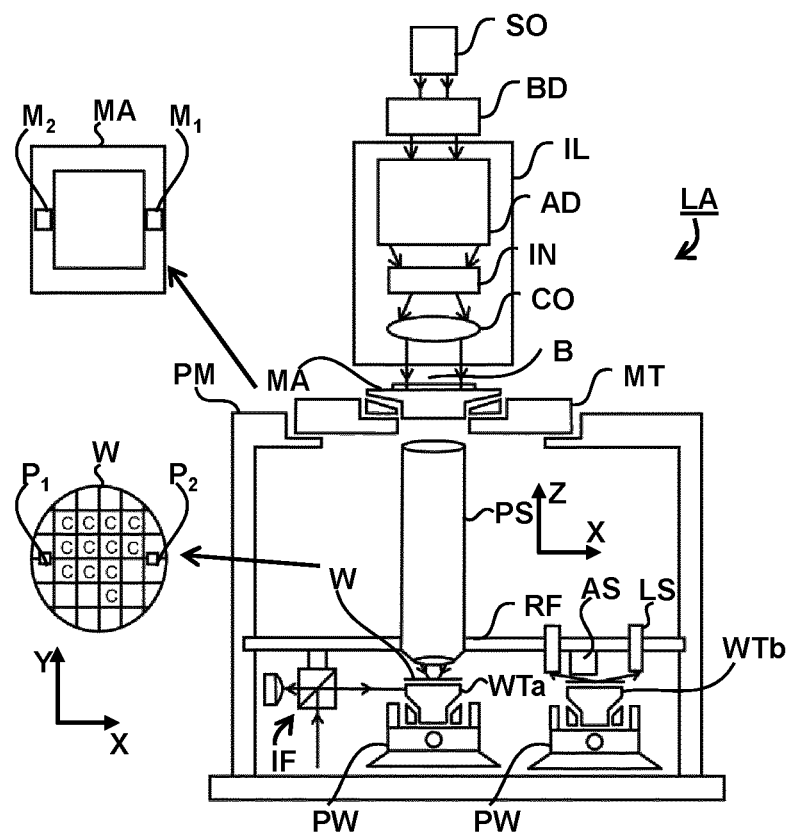
FIG. 1 schematically depicts an embodiment of a lithographic apparatus, according to an embodiment.

FIG. 1 schematically depicts a lithographic apparatus LA. The apparatus comprises:

an illumination system (illuminator) IL configured to condition a radiation beam B (e.g. DUV radiation or EUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WTa constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support structure holds the patterning device in a manner that depends on the orientation of the patterning device, the design of the lithographic apparatus, and other conditions, such as for example whether or not the patterning device is held in a vacuum environment. The patterning device support structure can use mechanical, vacuum, electrostatic or other clamping techniques to hold the patterning device. The patterning device support structure may be a frame or a table, for example, which may be fixed or movable as required. The patterning device support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix. More information on mirror arrays can be gleaned, for example, from U.S. Pat. Nos. 5,296,891 and 5,523,193, which are incorporated herein by reference. An example of programmable LCD array construction is given in U.S. Pat. No. 5,229,872, which is incorporated herein by reference.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more tables (e.g., two or more substrate table, two or more patterning device support structures, or a substrate table and metrology table). In such "multiple stage" machines the additional tables may be used in parallel, or preparatory steps may be carried out on one or more tables while one or more other tables are being used for pattern transfer. Twin stage lithographic projection apparatuses are described, for example, in U.S. Pat. No. 5,969,441, incorporated herein by reference.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table MT), and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WTa can be moved accurately, e.g., so as to position different target portions C in the path of the radiation beam B Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan. In general, movement of the patterning device support (e.g., mask table) MT may be realized with the aid of a long-stroke module (coarse positioning) and a short-stroke module (fine positioning), which form part of the first positioner PM Similarly, movement of the substrate table WTa may be realized using a long-stroke module and a short-stroke module, which form part of the second positioner PW. In the case of a stepper (as opposed to a scanner) the patterning device support (e.g., mask table) MT may be connected to a short-stroke actuator only, or may be fixed.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies Small alignment markers may also be included within dies, in amongst the device features, in which case it is desirable that the markers be as small as possible and not require any different patterning or other process conditions than adjacent features. An embodiment of an alignment system, which detects the alignment markers, is described further below.

The depicted apparatus could be used in at least one of the following modes:

In step mode, the patterning device support (e.g., mask table) MT and the substrate table WTa are kept essentially stationary, while an entire pattern imparted to the radiation beam is projected onto a target portion C at one time (i.e., a single static exposure). The substrate table WTa is then shifted in the X and/or Y direction so that a different target portion C can be exposed. In step mode, the maximum size of the exposure field limits the size of the target portion C imaged in a single static exposure.

In scan mode, the patterning device support (e.g., mask table) MT and the substrate table WTa are scanned synchronously while a pattern imparted to the radiation beam is projected onto a target portion C (i.e., a single dynamic exposure). The velocity and direction of the substrate table WTa relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In another mode, the patterning device support (e.g., mask table) MT is kept essentially stationary holding a programmable patterning device, and the substrate table WTa is moved or scanned while a pattern imparted to the radiation beam is projected onto a target portion C. In this mode, generally a pulsed radiation source is employed and the programmable patterning device is updated as required after each movement of the substrate table WTa or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA is of a so-called dual stage type which has two tables WTa, WTb (e.g., two substrate tables) and two stations—an exposure station and a measurement station—between which the tables can be exchanged. For example, while a substrate on one table is being exposed at the exposure station, another substrate can be loaded onto the other substrate table at the measurement station and various preparatory steps carried out. The preparatory steps may include mapping the surface control of the substrate using a level sensor LS and measuring the position of alignment markers on the substrate using an alignment sensor AS, both sensors being supported by a reference frame RF. If the position sensor IF is not capable of measuring the position of a table while it is at the measurement station as well as at the exposure station, a second position sensor may be provided to enable the positions of the table to be tracked at both stations. As another example, while a substrate on one table is being exposed at the exposure station, another table without a substrate waits at the measurement station (where optionally measurement activity may occur). This other table has one or more measurement devices and may optionally have other tools (e.g., cleaning apparatus). When the substrate has completed exposure, the table without a substrate moves to the exposure station to perform, e.g., measurements and the table with the substrate moves to a location (e.g., the measurement station) where the substrate is unloaded and another substrate is load. These multi-table arrangements enable a substantial increase in the throughput of the apparatus.

Figure 2:
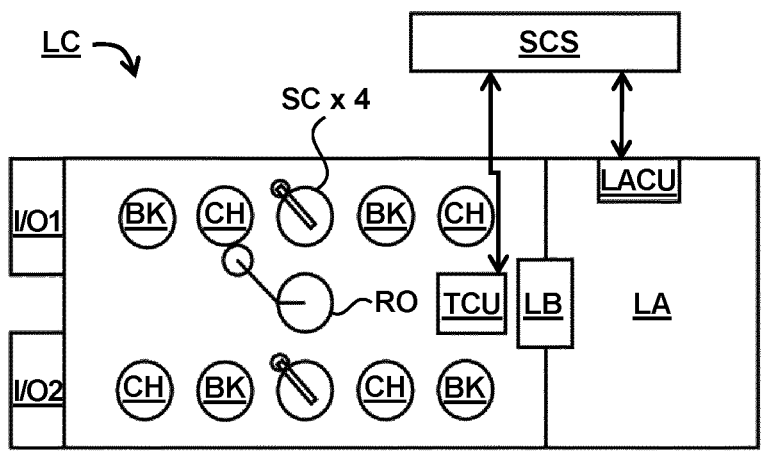
FIG. 2 schematically depicts an embodiment of a lithographic cell or cluster, according to an embodiment.

As shown in FIG. 2, a lithographic apparatus LA may form part of a lithographic cell LC, also sometimes referred to as a lithocell or lithocluster, which also includes apparatus to perform one or more pre- and post-pattern transfer processes on a substrate. Conventionally these include one or more spin coaters SC to deposit a resist layer, one or more developers DE to develop patterned resist, one or more chill plates CH and one or more bake plates BK. A substrate handler, or robot, RO picks up a substrate from input/output ports I/O1, I/O2, moves it between the different process devices and delivers it to the loading bay LB of the lithographic apparatus. These devices, which are often collectively referred to as the track, are under the control of a track control unit TCU which is itself controlled by the supervisory control system SCS, which also controls the lithographic apparatus via lithographic control unit LACU. Thus, the different apparatus may be operated to maximize throughput and processing efficiency.

In order that the substrate that is processed (e.g., exposed) by the lithographic apparatus is processed correctly and consistently, it is desirable to inspect a processed substrate to measure one or more properties such as overlay error between subsequent layers, line thickness, critical dimension (CD), etc. If an error is detected, an adjustment may be made to processing of one or more subsequent substrates. This may particularly useful, for example, if the inspection can be done soon and fast enough that another substrate of the same batch is still to be processed. Also, an already processed substrate may be stripped and reworked (to improve yield) or discarded, thereby avoiding performing a pattern transfer on a substrate that is known to be faulty. In a case where only some target portions of a substrate are faulty, a further pattern transfer may be performed only on those target portions which are good. Another possibility is to adapt a setting of a subsequent process step to compensate for the error, e.g. the time of a trim etch step can be adjusted to compensate for substrate-to-substrate CD variation resulting from a lithographic process step.

An inspection apparatus is used to determine one or more properties of a substrate, and in particular, how one or more properties of different substrates or different layers of the same substrate vary from layer to layer and/or across a substrate. The inspection apparatus may be integrated into the lithographic apparatus LA or the lithocell LC or may be a stand-alone device. To enable most rapid measurements, it is desirable that the inspection apparatus measure one or more properties in the patterned resist layer immediately after pattern transfer. However, the latent pattern in the resist may have a very low contrast—e.g., there is only a very small difference in refractive index between the part of the resist which has been exposed to radiation and that which has not—and not all inspection apparatus have sufficient sensitivity to make useful measurements of the latent pattern. Therefore measurements may be taken after a post-exposure bake step (PEB) which is customarily the first step carried out on a patterned substrate and increases the contrast between, e.g., exposed and unexposed parts of the resist. At this stage, the pattern in the resist may be referred to as semi-latent. It is also possible to make measurements of the developed resist image—at which point, e.g., either the exposed or unexposed parts of the resist have been removed—or after a pattern transfer step such as etching. The latter possibility limits the possibility for rework of a faulty substrate but may still provide useful information, e.g. for the purpose of process control.

Figure 3:
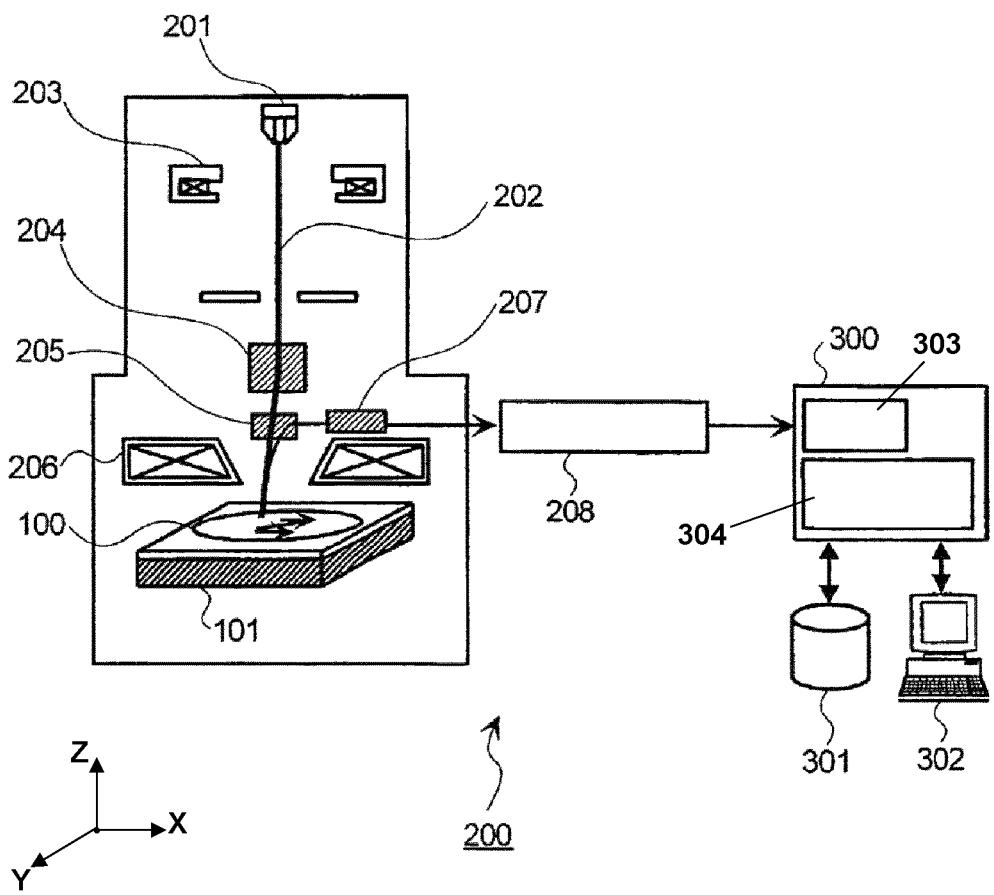
FIG. 3 schematically depicts an embodiment of a scanning electron microscope (SEM), according to an embodiment.

In some embodiments, the inspection apparatus may be a scanning electron microscope (SEM) that yields an image of a structure (e.g., some or all the structure of a device) exposed or transferred on the substrate. FIG. 3 depicts an embodiment of a SEM 200. A primary electron beam 202 emitted from an electron source 201 is converged by condenser lens 203 and then passes through a beam deflector 204, an E×B deflector 205, and an objective lens 206 to irradiate a substrate 100 on a substrate table 101 at a focus.

When the substrate 100 is irradiated with electron beam 202, secondary electrons are generated from the substrate 100. The secondary electrons are deflected by the E×B deflector 205 and detected by a secondary electron detector 207. A two-dimensional electron beam image can be obtained by detecting the electrons generated from the sample in synchronization with, e.g., two dimensional scanning of the electron beam by beam deflector 204 or with repetitive scanning of electron beam 202 by beam deflector 204 in an X or Y direction, together with continuous movement of the substrate 100 by the substrate table 101 in the other of the X or Y direction.

A signal detected by secondary electron detector 207 is converted to a digital signal by an analog/digital (A/D) converter 208, and the digital signal is sent to an image processing system 300. In an embodiment, the image processing system 300 may have memory 303 to store all or part of digital images for processing by a processing unit 304. The processing unit 304 (e.g., specially designed hardware or a combination of hardware and software) is configured to convert or process the digital images into datasets representative of the digital images. Further, image processing system 300 may have a storage medium 301 configured to store the digital images and corresponding datasets in a reference database. A display device 302 may be connected with the image processing system 300, so that an operator can conduct necessary operation of the equipment with the help of a graphical user interface.

As noted above, SEM images may be processed to extract contours that describe the edges of objects, representing device structures, in the image. These contours are then quantified via metrics, such as CD. Thus, typically, the images of device structures are compared and quantified via simplistic metrics, such as an edge-to-edge distance (CD) or simple pixel differences between images. Typical contour models that detect the edges of the objects in an image in order to measure CD use image gradients. Indeed, those models rely on strong image gradients. But, in practice, the image typically is noisy and has discontinuous boundaries. Techniques, such as smoothing, adaptive thresholding, edge-detection, erosion, and dilation, may be used to process the results of the image gradient contour models to address noisy and discontinuous images, but will ultimately result in a low-resolution quantification of a high-resolution image. Thus, in most instances, mathematical manipulation of images of device structures to reduce noise and automate edge detection results in loss of resolution of the image, thereby resulting in loss of information. Consequently, the result is a low-resolution quantification that amounts to a simplistic representation of a complicated, high-resolution structure.

So, it is desirable to have a mathematical representation of the structures (e.g., circuit features, alignment mark or metrology target portions (e.g., grating features), etc.) produced or expected to be produced using a patterning process, whether, e.g., the structures are in a latent resist image, in a developed resist image or transferred to a layer on the substrate, e.g., by etching, that can preserve the resolution and yet describe the general shape of the structures. In the context of lithography or other pattering processes, the structure may be a device or a portion thereof that is being manufactured and the images may be SEM images of the structure. In some instances, the structure may be a feature of semiconductor device, e.g., integrated circuit. In this case, the structure may be referred as a pattern or a desired pattern that comprises a plurality of feature of the semiconductor device. In some instances, the structure may be an alignment mark, or a portion thereof (e.g., a grating of the alignment mark), that is used in an alignment measurement process to determine alignment of an object (e.g., a substrate) with another object (e.g., a patterning device) or a metrology target, or a portion thereof (e.g., a grating of the metrology target), that is used to measure a parameter (e.g., overlay, focus, dose, etc.) of the patterning process. In an embodiment, the metrology target is a diffractive grating used to measure, e.g., overlay.

Figure 4:
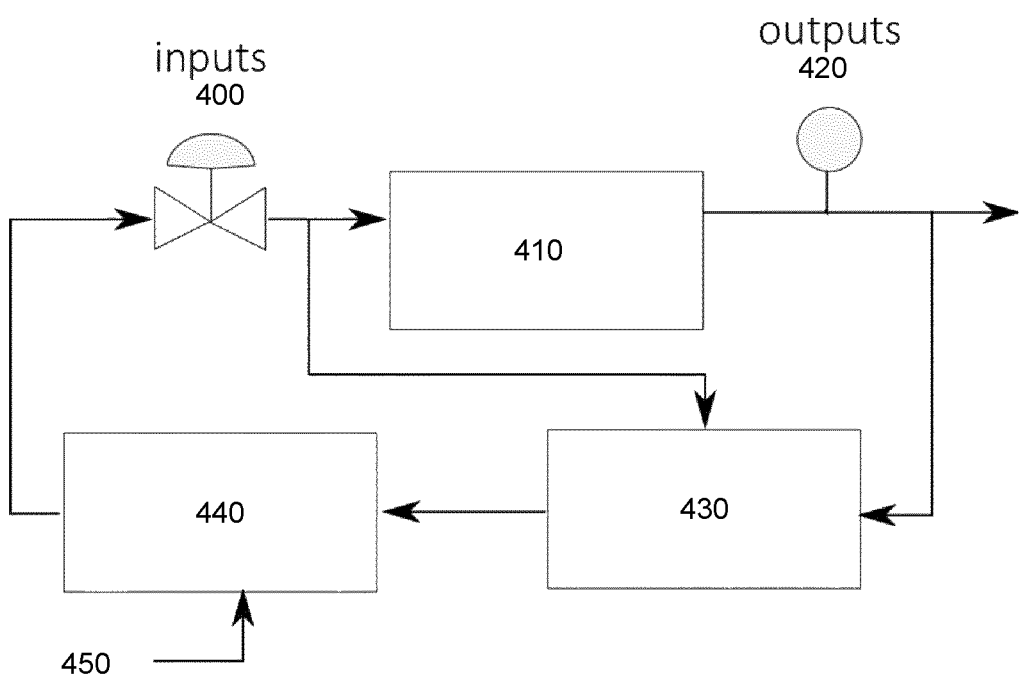
FIG. 4 schematically depicts an overview of an example model prediction system, according to an embodiment.

Referring to FIG. 4, an overview of an example model prediction system according to an embodiment is depicted. In an embodiment, the system of FIG. 4 is an adaptive state estimation and model predictive control system for a patterning process (e.g., both the lithographic and etch processes of a patterning process). In the following discussion, the model prediction system (and associated techniques) will be described in relation to a patterning process involving an optical lithographic process. In another embodiment, a different patterning process can be used, e.g., one involving imprint lithography. And so, for such a different patterning process, one or more different parameters/variables may be involved as would be appreciated by those skilled in the art.

At 400, certain inputs to the model prediction system are provided. For example, nominal values of focus, dose, optical aberration, illumination mode (e.g., spatial distribution, such as an annular, dipole, quadrupole, etc.), etc. of the patterning process can be input. Further, a design pattern to produce the structure using the patterning process is input. In a typical embodiment, the design pattern is a patterning device (e.g., mask) pattern. In combination, the input values define a particular patterning process. As will be appreciated a different combination of parameters/variables can define a different patterning process.

At 410, a mathematical model of at least part of the patterning process receives the inputs. The model produces an output 420 as further described below. In an embodiment, the model can predict the structure, as produced using the patterning process, as a latent image in a resist. In an embodiment, the model can predict the structure, as produced using the patterning process, as an image in the resist after development of the resist but before etch. In an embodiment, the model can predict the structure, as produced using the patterning process, after etch. As will be discussed more hereafter, in an embodiment, the model is a machine learning model configured to predict an on-product pattern shape after, e.g., a lithography step of the patterning process or after an etch step of the patterning process. In an embodiment, the machine learning model is trained to predict SEM images of the structure. In an embodiment, the machine learning model is trained based on the inputs such as in at 400 including, but not limited to, SEM images, dose, focus, metrology parameters, etc.

At 420, the model produces one or more outputs that reflect the prediction of the structure being produced using the patterning process. In an embodiment, the output is a predicted image of the structure predicted to be produced using the patterning process. In an embodiment, the output is a predicted parameter (e.g., CD) pertaining to the image or the structure predicted to be produced using the patterning process.

At 430, a state of the model can be estimated. In an embodiment, on-product measurements of the pattern shape as actually produced using the patterning process can be used to identify the model (e.g., a machine learning model) and estimate its parameters. Via state estimation, the model can be, in an embodiment, continually and recursively updated such that model predictions match a measured output as the patterning process runs. This is advantageous as there will likely be a mismatch between an open-loop model prediction and measured reality; for example, a lithographic apparatus behaving differently than expected, an etch tool behaving differently than expected, a process drift, other disturbances, etc. can cause such a mismatch. The mismatch deteriorate yield of the patterning process and so, in an embodiment, is estimated during the execution of patterning process in order to control the patterning process.

As seen, in FIG. 4, the estimation of the state at 430 can take as inputs the predicted output 420 from the model 410 and one or more of the patterning process inputs 400. The estimation of the state at 430 can produce one or more parameters of the mathematical model 410. In an embodiment, the estimation of the state at 430 can receive as an input a measurement of one or more patterning process disturbances.

At 440, the model prediction system can regulate the pattern output to one or more targets 450. The one or more targets 450 may specify a certain desired value of a parameter/variable (e.g., a desired CD, etc.). The regulator at 440 can produce an appropriate change or correction to one or more inputs 400 to the model prediction system.

An example model 410 (e.g., of lithographic process and/or a litho-etch process) is discussed in the PCT patent publication No. WO2018108528A1, filed on Dec. 16, 2016, which is incorporated herein by reference in its entirety. This model 410 is a logistic model that predicts a binarized image of the pattern shape of the structure produced after the lithographic or etch process. This logistic model is based on a handful of engineered features that results in near-perfect binary product predictions. However, the output of the model was strictly binary and further improvements in predictions of the pattern shape of the structure can be made, as will be discussed in the present disclosure.

In an embodiment of the present disclosure, the modelling approach involves a semantic segmentation of images to enable pixel-level predictions of multi-class labels (e.g., corresponding to one or more pattern shapes of a structure to be printed by the patterning process). This allow to convert any image that is measured by the SEM/e-beam to a pixel level multi-class image. In an embodiment, the class refers to a grayscale value. Furthermore, the semantic segmentation can be modified to refine the segmentation to uniquely identify pattern types (e.g., by coloring power lines, or small lines differently), or allow for multi-patterning. Further, the machine learning model is configured to predict a multi-class semantic segmentation image, which is further converted to a grayscale image similar to what a metrology tool (e.g., SEM tool) may measure. In an embodiment, the machine learning model (e.g., which can be used as 410 in FIG. 4) predicts an image as measured by the SEM/e-beam given a mask image that is used to print a pattern shape of the structure at a measurement location.

SEM images (e.g., captured via SEM in FIG. 3) typically contain non-informative measurement noise. In an embodiment, the machine learning model is configured to predict an image representative of an semantic segmentation of the SEM image with no noise. In an embodiment, such noise-free prediction can be achieved since the multi-class semantic segmentation is converted to a grayscale image, similar to what a SEM imaging process would produce. The conversion to gray-scale involves binning or grouping of selected pixels having a pre-defined range of pixel values and assigning a particular label to a particular group of pixels. For example, the grouping is uniform, where the range of pixel values [0, 255] is evenly divided into 10 groups (or 10 labels). In an embodiment, grouping is based on user-defined features of a pattern, and/or pixel values corresponding to a desired pattern shape of the structure.

According to an embodiment, the training of the machine learning model is based on one or more deep learning architectures and algorithms. Deep learning refers to training a neural network including multiple layers, which can be either supervised or unsupervised. In an embodiment, a deep learning model may be based on architectures such as residual nets, convolutional neural networks, deep belief networks and recurrent neural networks. In an architecture based on convolutions, each layer performs certain convolution operations based on one or more kernels (typically defined by weights associated with the kernels). During the training process, the deep learning model may be modified by adjusting the kernels (i.e. changing the kernel weight values).

A convolutional neural network typically consist of several layers chained together in a subsequent manner, such that information flows from input to output. Effectively, each layer takes in a tensor Tin and outputs a new tensor Tout. The input tensor is convolved with a kernel tensor W, the resulting convolution may be increased with a bias vector and passed through an activation function such as a rectifier LinearUnit (ReLU). In the present disclosure, one or more dilated kernels may be used in order to increase the receptive field without doing max-pooling (since it may deteriorate spatial resolution). The dilated kernel is a kernel used with the dilation operation. Typically, a max-pooling is an operation that uses the maximum value from each of a cluster of neurons at the prior layer.

The deep learning model needs to be trained, and object (or features within an image) labels may be domain specific. As such, in an embodiment, a set of training data is generated or obtained as ground truth, for example, the ground truth may include a set of raw input images (e.g., SEM images) corresponding to a mask pattern. In an embodiment, for training purposes, a pixel is assigned an object label (e.g., grayscale level).

The following disclosure describes a method for training a deep learning model that performs a semantic segmentation of an image (e.g., a gray-scale SEM image). For example, the present method assigns to each image pixel x, a label L(x) from a set of predetermined labels L via convolutional neural networks (deep learning), and specifically dilated residual neural networks (ResNets). In the present disclosure, the term label is used interchangeably with a class label or a feature of a wafer (can be interchangeably referred as substrate) to generally refer to a particular feature of a wafer. In an embodiment, the class label is a grayscale level, where each class level is associated with a range of grayscale value (e.g., between [0, 255]).

Figure 5:
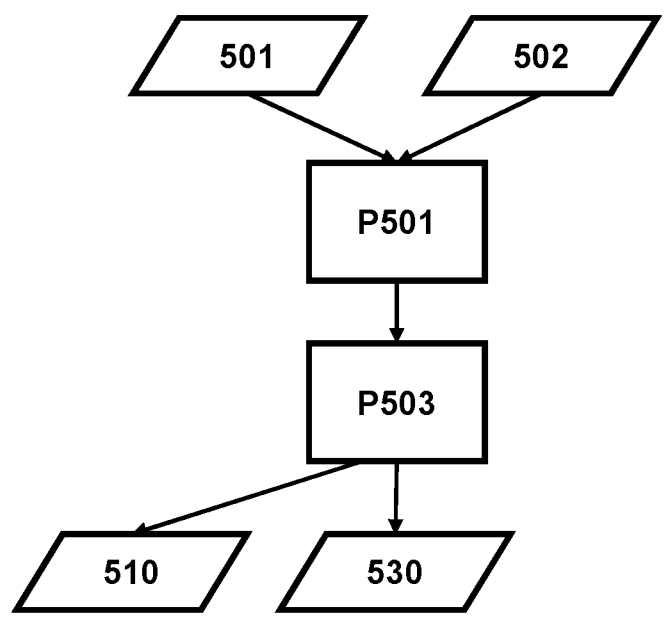
FIG. 5 is a flow chart of a method for training a machine learning model configured to predict an image of the printed pattern of a substrate subjected to a patterning process, according to an embodiment.

FIG. 5 is a flow chart of an exemplary method for training a machine learning model configured to predict an image of the printed pattern of a wafer subjected to a patterning process in accordance with an embodiment of the present disclosure. The predicted image corresponds to measurement data (e.g., SEM image comprising structures printed on the wafer) obtained from a metrology tool (e.g., SEM). The predicted image has substantially low noise or no noise compared to the noise typically seen in a SEM image (e.g., 701 in FIG. 7). Thus, more accurate measurements (e.g., CD, EPE, etc.) of structures (in an embodiment, patterns) can be obtained from the predicted image compared to that obtained directly from a corresponding SEM image.

The method, in process P501, involves obtaining a training data set comprising (i) metrology data 501 of the metrology tool used to measure the printed pattern of the wafer, and (ii) a patterning device pattern 502 (referred as a mask pattern 502 (or a mask image thereof), hereinafter for better readability) employed for imaging, via a lithographic apparatus, the printed pattern on the wafer.

In an embodiment, the training data set includes a plurality of SEM images obtained from the SEM tool. In an embodiment, the training data set may also include parameters of the metrology tool. For example, the parameters of the scanning electron microscope are at least one of: an e-beam intensity; an angle of incidence; or a sampling location information. In an embodiment, the training data set may also include values of one or more parameters of the patterning process. In an embodiment, the one or more parameters of the patterning process include at least one of dose, focus, intensity, illumination mode, etc. Thus, after training, the trained machine learning model may also receive parameters of the metrology tool and the patterning process to make more accurate predictions of a wafer image.

In an embodiment, the metrology data 501 includes an image (e.g., SEM image) of the printed pattern on the wafer captured via the metrology tool. Such image may include noise, distortions, other image related issues due to the metrology tool and measurement processes. In an embodiment, a metrology recipe (e.g., intensity, angle of incidence, etc.) of the metrology tool is used during measurements of the printed pattern on the wafer.

In an embodiment, mask pattern 502 is obtained in a form of an image or other equivalent representations. In an embodiment, the mask pattern 502 is an image of a design layout, and/or a design layout including structures corresponding to OPC (e.g., SRAF, SERIFs). In an embodiment, the mask pattern 502 is a binary image, e.g., an OPC'ed mask image 702 in FIG. 7. In an embodiment, the mask image includes SRAFs placed around OPC'ed primary feature.

The method, in process P503, involves training, based on the training data set, a machine learning model to predict a wafer image 510 as measured by the metrology tool such that a cost function is improved. In an embodiment, the cost function comprises a relationship between the predicted wafer image 510 and the metrology data 501. For example, the relationship of the cost function is a difference in labels of the predicted wafer image 510 and a labeled SEM image of 501. In an embodiment, the cost function is a generalized dice loss, which can be reduced (in an embodiment, minimized) during the training process. The dice loss function may evaluate multiple class segmentation with a single score. For example, the dice loss function evaluates multiple class segmentation of the predicted image 510 with respect to the SEM image of the metrology data 501. An example dice loss function is given as follows:

$$GDL = 1 - 2 \frac{\sum_{l=1}^{L} w_l \sum_{n=1}^{N} r_{ln} p_{ln}}{\sum_{l=1}^{L} w_l \sum_{n=1}^{N} r_{ln} + p_{ln}}$$

In the generalized dice loss (GDL) equation above, N is number of pixels, L is number of labels (e.g., 2 labels in a two-label class problem), $r_{ln}$ is a pixel value corresponding to a particular label l (e.g., a ground truth label or a reference pixel) assigned to n-th pixel, $p_{ln}$ is an image element, where the image element is associated with a probability that the pixel belongs to a particular label (e.g., pixel having label l assigned to n-th pixel), $w_l$ is used to provide invariance to different label set properties. In an embodiment, $w_l=1/(\sum_{n=1}^{N} r_{ln})^2$. When choosing the weighting, the contribution of each label is corrected by the inverse of its area, thus reducing the well-known correlation between region size and Dice score. In an embodiment, when training with gradient descent method, the gradient of the cost function is determined with respect to $p_{ln}$ and weights of each layer may be determined based on the gradient such that the cost function is reduced (in an embodiment, minimized).

In an embodiment, the machine learning model outputs the predicted image 510, which may be a pixelated image. The pixelated image can be further segmented to generate a segmented image. In an embodiment, each pixel is assigned a class label of the plurality of class labels based on a probability of the pixel belonging to a particular class of the plurality of class labels. In an embodiment, each class label of the plurality of class labels correspond to a grayscale level. In an embodiment, the trained machine learning model directly outputs the segmented image of a printed wafer corresponding to the mask pattern. The segmented image comprises a plurality of class labels assigned to pixels of the predicted image of the printed pattern, where the pixels correspond to a particular feature of the printed pattern.

In an embodiment, in the context of an output (e.g., a pixelated image) of the machine learning model, the image may be projected to a logistic model comprising a sigmoid function in the form of, e.g.:

$$P(x, y) = \frac{1}{1 + e^{-\gamma(a(x,y)-\tau)}}$$

In the above logistic model, P(x, y) is the probability of a pixel to belong to a particular class, the image a(x, y) is the output of the machine learning model as described above, y determines the slope of the sigmoid, and $\tau$ is the threshold that determines the a for which P=0.5 (equal probability of belonging to a particular class). Thus, in an embodiment, the probability P∈[0,1]. In this example, the maximum value of the logistic model is 1, in which case $\tau$ is the threshold that determines the a for which P is half of that maximum value. Accordingly, the probability of different pixels corresponds to particular classes or labels. Thus, when assigning a label to a pixel (i.e. predicting it), the associated probabilities give additional information about how certain/accurate is the label assignment. For example, when more labels have very similar probabilities, it indicates that more data (e.g., augmented training set) is needed.

In an embodiment, the grayscale level is an integer value indicating a grouping of a range of grayscale values. In one embodiment, the grouping of the grayscale values is based on: uniform grouping; pixels corresponding a particular feature of the mask pattern desired to be printed on the wafer; pixels corresponding to a particular feature of a printed pattern; and/or weighted pixel grouping, where higher weight is assigned to grayscale values of the features occurring more frequently than other features of the mask pattern (or printed pattern), or image thereof. For example, an uniform grouping involves equally dividing grayscale values [0, 255] into L labels (e.g., for 10 labels, a first label L1 corresponds to grayscale values 0-25, a second label L2 corresponds to grayscale values 26-51, and so on.) Another example of grouping is by equal histogram splitting, where the ranges are chosen such that each bin of the histogram has a similar number of entries.

In an embodiment, the training of the machine learning model is an iterative process. In an iteration involves determining values of model parameters of the convolutional neural network based on the metrology data 501 and the mask pattern 502; and adjusting the values of the model parameters until the cost function of the convolutional neural network is improved. For example, weights and/or biases associated with one or more layers of the CNN may be changed during a backpropagation algorithm. In an embodiment, the adjusting of the weights may be guided by a (stochastic) gradient descent method, where a gradient decent of a cost function (e.g., generalized dice loss) is evaluated and weights are adjusted such that the cost function is minimized Reducing or minimization of the cost function brings the predicted output (e.g., predicted image) close to the ground truth image (e.g., a manually segmented SEM image).

In an embodiment, the method of FIG. 5, further involves determining a characteristic of the printed pattern of the wafer based on the predicted wafer image. In an embodiment, the characteristic is a critical dimension, a contour of the feature, and/or an edge placement error.

In embodiment, the method further includes acquiring, via the metrology tool, real-time (e.g., on product as discussed in FIG. 4) metrology data during or after the patterning process, updating the trained machine learning model based on the real-time metrology data and the mask pattern 502 used during the patterning process.

Figure 7:
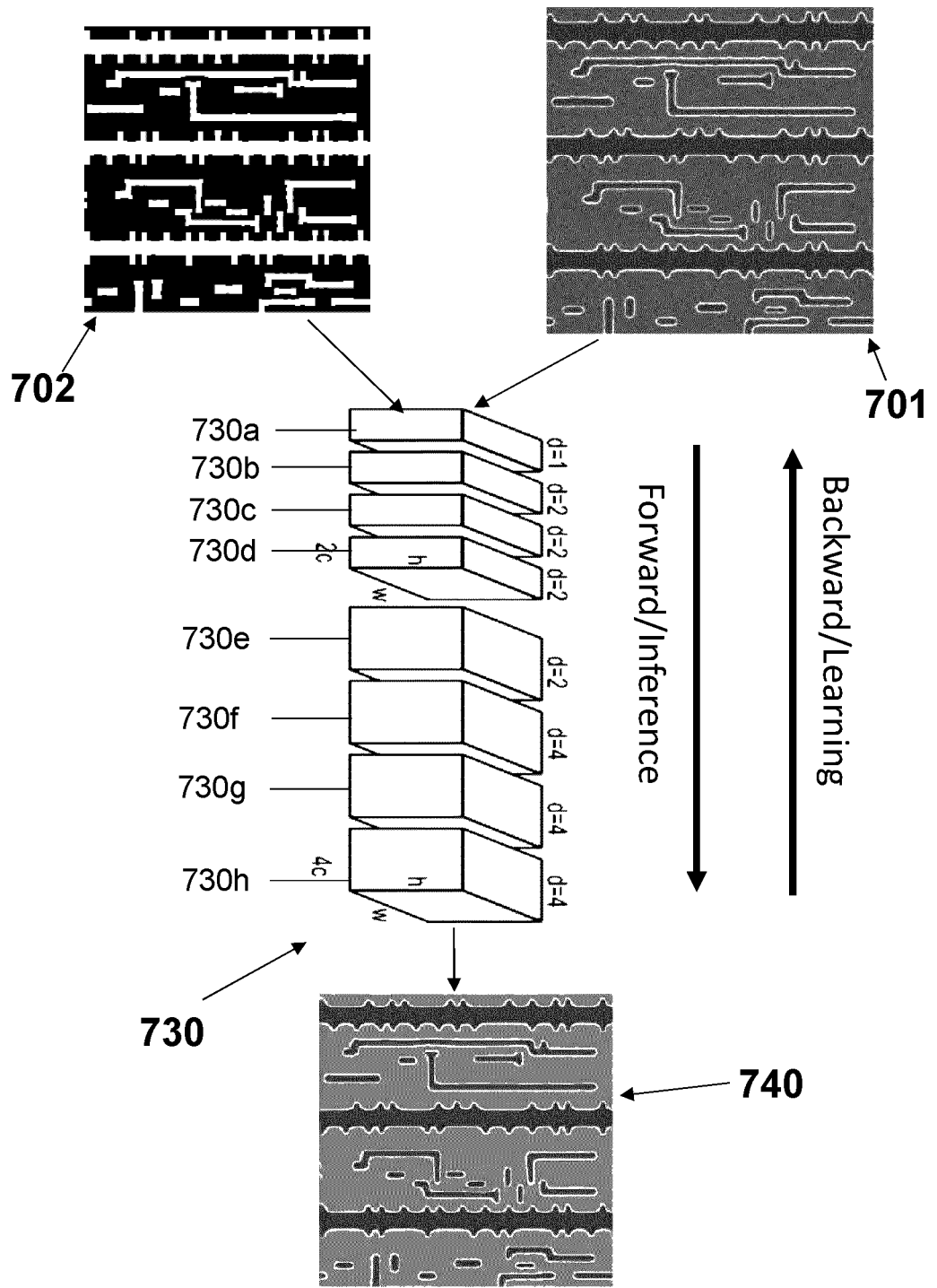
FIG. 7 illustrates an example training of a deep learning model using method in FIG. 5, according to an embodiment.
Figure 8:
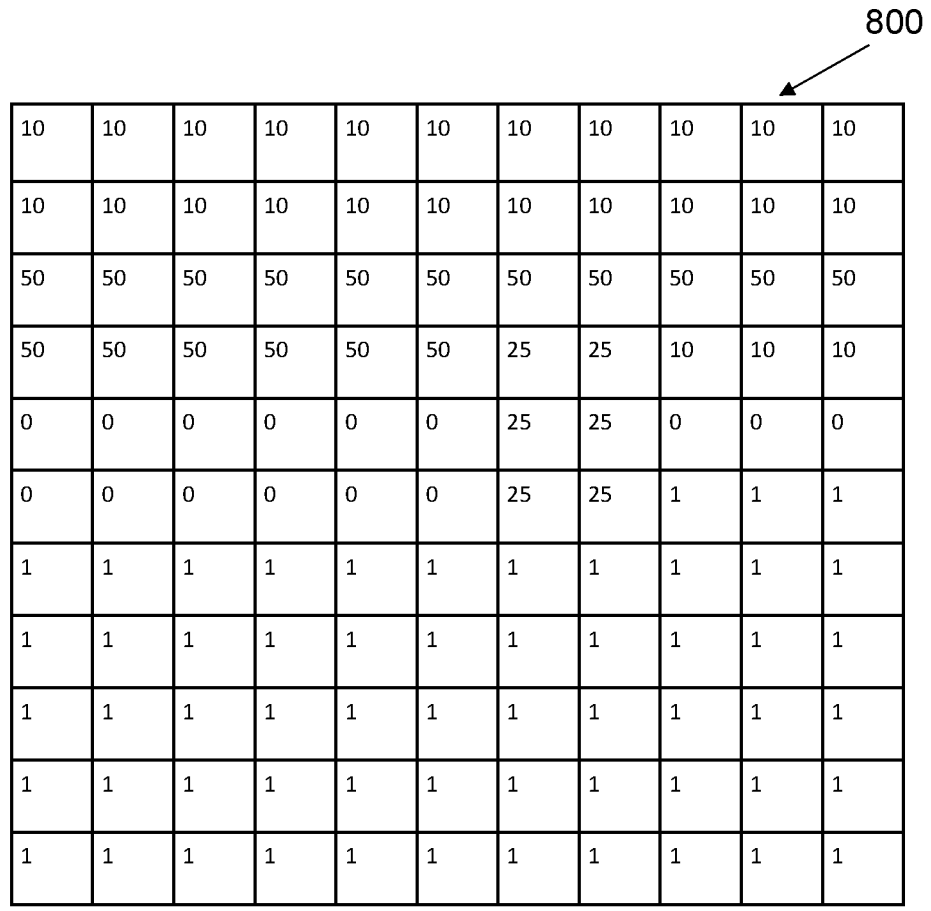
FIG. 8 illustrates an example of a pixelated input image used for training the deep learning model, according to an embodiment, according to an embodiment.

The method of FIG. 5 is further discussed with an example in additional details with respect to FIG. 7 below. It can be understood by a person skilled in the art that the training process in FIG. 7 is not limited to a deep learning model 730 or to images 701 and 702. The model 730 and images 701 and 702 are only used for illustrative purposes and better convey the concepts of the present disclosure.

FIG. 7 illustrates an example training of the deep learning model 730 (an example of the machine learning model 530 of method in FIG. 5) in accordance with an embodiment of the present disclosure. As illustrated, the deep learning model comprises a convolutional neural network having several layers that are chained together in a subsequent manner. Each layer performs convolution operations with (e.g., dilated) kernels (e.g., discussed with FIGS. 8, 9A-9B, 10A-10C). Dilated kernels enlarge the receptive field of an input image and preserves the spatial resolution of the input image and hence the features within it. This enables accurate labeling of even the smallest features of a wafer. As such, the trained deep learning model is capable of detecting and accurately labeling features of small size such as less than 20 nm. In other words, in an embodiment the model can segment an image at a pixel level, which can be significantly smaller than 5 nm, preferably less than approximately 2 nm.

The trained deep learning model may be used to perform semantic segmentation of, for example, SEM images obtained during the patterning process, and determine various features and parameters of the patterning process by performing measurements of the features identified in a segmented image of the SEM image. According to the present disclosure the semantic segmentation is based on grayscale level (0, 1, 2, 3, . . . n-th level) and a generalized dice loss function. The gray-scale levels are labels assigned to the pixels based on grayscale values of the pixels and grouping of the grayscale values, as discussed earlier in FIG. 5.

In present embodiment, input images include mask pattern 702 and SEM image 701 in form of pixelated images, which can be represented in the form of a tensor or a vector to enable various mathematical operation (e.g., convolution, addition, multiplication, rotation, scaling, etc.), statistical analysis and/or other suitable manipulation of each pixel of the input image. Furthermore, based on the analysis, each pixel may be labelled (e.g., with one or more grayscale levels).

In an embodiment, the input images 701 and 702 may be represented as an input tensor having dimensions (b, w, h, c), where b represents a batch size (e.g., total number of images used for training), w represents a width of the input image (or a tensor), h represents the height of the input image (or a tensor), c represents a channel (i.e., number of classes/labels/features). In an embodiment, each pixel of the SEM image may have a grey-scale value such as a pixelated input image 800 illustrated in FIG. 8.

As shown in FIG. 7, the deep learning model 730 receives, as input, the mask pattern 702 and the SEM image 701 of a printed pattern, and the set of classes (e.g., grayscale levels). Further, on the inputs, the model 730 performs (e.g., by modeling and/or simulation) convolution with dilated kernels during the training process. The model 730 is trained such that the trained deep learning model predicts different features of any input image (e.g., a design layout, mask image, or OPC'ed mask image) and label each feature within the predicted image to produce a segmented image 740 that accurately mimics a SEM image 701 (e.g., more than 99% match, minimized a mean dice score, etc.). The predicted image has reduced noise or no noise compared to a SEM image obtained from a SEM (e.g., FIG. 3).

A neural network of the model 730 includes a plurality of layers that are chained together in a subsequent manner Each layer of the plurality of layers may include a number of interconnected nodes which contain an activation function. An activation function non-linearly maps elements (e.g., values related a pixels of an input image) of an input tensor to an output tensor. For example, the activation function a may be a non-linear function such as a rectified linear unit (ReLU). An example activation function is as follows:

$$a = \sigma\left(\sum_i w_i x_i - \theta\right)$$

In the activation function above, (i) a is the activation function, which can be a sigmoid function (e.g., in an embodiment, at a last layer), (ii) $w_i$ is a weight of the $i^{th}$ element of the input tensor, (iii) $x_i$ is the value of the $i^{th}$ element of the input tensor, and (iv) θ is a bias. The set of all weights and biases may also be referred as model parameters. Such activation function is typically a non-linear function which enables the deep learning model 730 to generalize or adapt with variety of data (e.g., different pixels of the input tensor). The non-linear activation functions allow to define a rich model class that contains models that are effective, for example, for computer vision based tasks. The present disclosure is not limited to a type of activation function.

During the training process, the weights may be initialized to random values (e.g., based on Gaussian distribution between 0 to 1) and during the training process such weights may be optimized via backpropagation and specific update rules (e.g., Adam update rule). The optimization using a cost function and backpropagation is discussed below in the disclosure. The weights may be updated to identify a particular feature of the input images such as the SEM image 701 and the mask pattern 702 accurately, so that the trained deep learning model can predict features corresponding to a different mask pattern.

The training involves a forward propagation of an input (e.g., 701 and 702) through different layers (e.g., a first layer, a second layer generating output tensors 730a-730h) of the neural network to reach an output (e.g., layer 730h). At an output layer (e.g., a last layer of 730h), an output tensor representing the predicted image is obtained.

During the forward propagation, at each layer, a convolution operation with dilated kernels is performed. The convolution operation comprises overlapping a portion of the input images 701 and 702 with a dilation kernel, taking a product between each overlapping elements including a weight of the dilation kernel and a value of a pixel of the input images 701 and 702, and summing the results of the product. For example, in FIG. 10A, a first 3×3 dilation kernel 1010 overlaps with a pixelated input tensor 1000, each of the element of the dilation kernel overlapping with a pixel of the input tensor. Then, a product of values of each of the overlapping element (e.g., a value of the pixel and a weight of the kernel) may be computed and further the products may be summed to determine an element of the output tensor. Furthermore, the first dilation kernel may then be shifted by one stride (e.g., by a column of one pixel to the right) and similar convolution operation is performed on a new overlapping elements of the input tensor and the kernel element (i.e., weights) to determine a second element of the output tensor.

In an embodiment, iteratively performing the convolution may involve performing a plurality of convolution operations with one or more dilation kernels within a particular layer on an input tensor (e.g., a representation 800 in FIG. 8 of the input images 701 and 702 in FIG. 7) for that layer. For example, a first layer may receive the input tensor (e.g., a representation of the input image such as 800 in FIG. 8). On the input tensor, the first layer performs a convolution operation using a first dilation kernel. The first dilation kernel having a first set of weights (e.g., of kernel 910 in FIG. 9B). The result of the convolution is a first output tensor (e.g., 730a in FIG. 7), which is passed through a first activation function of the first layer to a second layer Similar to the first layer, the second layer also performs a convolution operation using a second dilation kernel. The second dilation kernel having a second set of weights, which may be the same or different from the first set of weights of the first kernel. The output of the second layer may be a second output tensor (e.g., 730b in FIG. 7), and so on. In an embodiment, the first kernel and the second kernel itself may be different which will result in different output tensors. The present disclosure is not limited to one convolution operation with one dilated kernel per layer.

The training process may involve convolution of the input tensor with a plurality of dilation kernels per layer of the deep learning model 730, resulting in a plurality of output tensors. For example, in FIG. 7, a first layer may output four different output tensors (e.g., four tensors 730a-730d), each resulting from convolution with different dilation kernels such as a first dilation kernel having dilation rate 1 and depth of 2c, and a second dilation kernel having a dilation rate of 2 and depth of 2c. Similarly, a second layer may output four different output tensors 730e, 730f, 730g and 730h, each resulting from convolution with different respective dilation kernels such as a third dilation kernel having dilation rate 2 and depth of 4c, and a fourth dilation kernel having a dilation rate of 4 and depth of 4c.

Figures 9A, 9B:
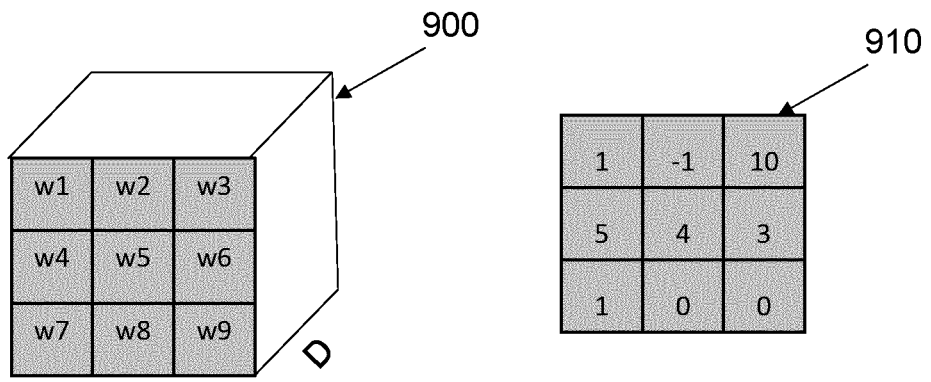
FIG. 9A illustrates an example of a dilated kernel used for training the deep learning model, according to an embodiment.
FIG. 9B illustrates an example weights of a dilated kernel used for training the deep learning model, according to an embodiment.
Figure 10A:
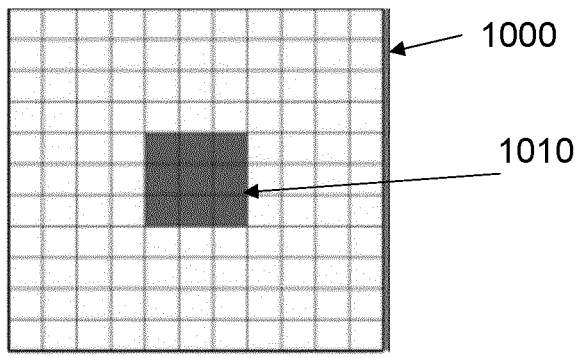
FIG. 10A illustrates an example convolution operation with a first dilated kernel for training the deep learning model, according to an embodiment.
Figure 10B:
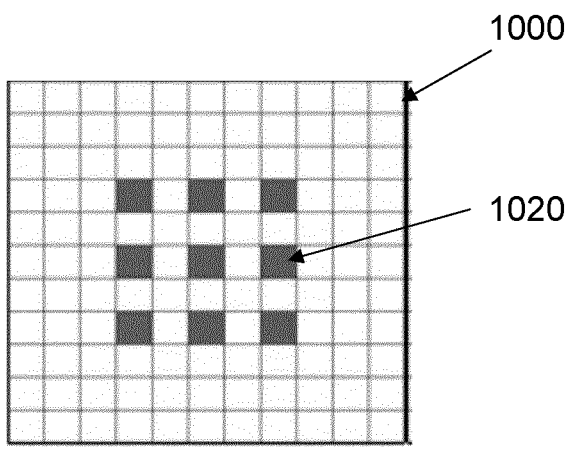
FIG. 10B illustrates an example convolution operation with a second dilated kernel for training the deep learning model, according to an embodiment.
Figure 10C:
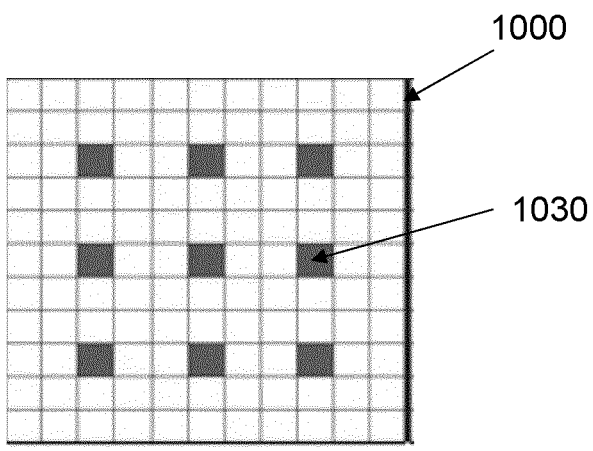
FIG. 10C illustrates an example convolution operation with a third dilated kernel for training the deep learning model, according to an embodiment.

In an embodiment, a dilation kernel may be characterized by a plurality of weights, depth (i.e., class), a dilation rate, or a combination thereof. In an embodiment, the dilation rate is a parameter related to the model/architecture, one could consider this a hyperparameter. In an embodiment, the 'best' value of the dilation rate is determined empirically, e.g., by considering different architectures and choosing a value for which a model/architecture performs best with respect to the cost function (e.g., GDL). In a first pass, the weights may be randomly assigned (e.g., based on Gaussian distribution between 0 and 1) and later modified during the training process. The dilation rate may be an integer value, for example, between 1 and 10, which is chosen at the start of the training process and remain fixed during the training process. For example, FIG. 9A illustrates a dilated kernel 900 in the form of a 3×3 grid, each element of the grid having a particular weight (e.g., w1-w9). The dilated kernel 900 also has a depth D (e.g., a total number of features (e.g., depth D is equal to number of classes at the final layer)). Any dilated kernel such as 900 may be also represented in the form a tensor, also referred as weight tensor (or weight kernel). In another example, FIGS. 10A-10C illustrate examples of different dilation kernels such as the first 3×3 dilation kernel 1010 having a dilation rate of 1 (in FIG. 10A), a second 3×3 dilation kernel 1020 having a dilation rate of 2 (in FIG. 10B), and a third 3×3 dilation kernel 1030 having a dilation rate of 3 (in FIG. 10C).

During the training process, the weights of the one or more dilated kernels may be iteratively modified and/or assigned. The iteratively assigning of the weights may be performed to improve predictions of one or more features of the output tensor (e.g., 730h). Such assignments of weights are done during the training procedure, such as, using backpropagation based on a local derivative of a cost function (discussed later in the disclosure). In an embodiment, the iteratively assigning weights may include assigning/adjusting a set of weights of the dilated kernel to account for, for example, aberrations of a projection system, of an apparatus of the patterning process. In an embodiment, the iteratively assigning weights may include assigning/adjusting a set of weights of the dilated kernel to characterize an aspect of the patterning process.

The predicted image 740 (i.e., an image representation of the output vector) includes elements (i.e., pixels) corresponding to the pixels of the input image (e.g., the mask pattern 702), each element of the predicted image having values associated with the set of classes (i.e. grayscale levels corresponding to one or more feature of the wafer) which can be assigned unique label (i.e., gray-scale levels corresponding to each of a contact hole, a line, a bar, etc.). In an embodiment, assigning a class of the set of classes to an element of the predicted image 740 may be based on a comparison of the predicted image 740 with the ground truth image 701 or truth tensor. In an embodiment, the elements of the predicted image 740 include a set of probabilities (or probability distribution per class per pixel) associated with each class of the set of classes. The probability value indicating a probability that a particular element of the predicted image 740 belongs to a particular class. Based on the probability, a label may be assigned to each pixel, where the label corresponding to the class having maximum probability value for that element. For example, a probability of a first element associated with one of the 10 classes (e.g., a line class, a bar class, a contact hole class, etc.) may have probability values as follows, represented by vector, [0.1 0.2 0.3 0.4 0.5 0.6 0.7 0.8 0.5 0.95]. In an embodiment, the vector may have normalized probability values such that it sums up to 1.

In a first forward pass, the output at the last layer may deviate from the ground truth (e.g., SEM image 701). This deviation is characterized by a cost function (e.g., generalized dice loss as mentioned earlier in method of FIG. 5) to quantify the amount of deviation between the predicted image 740 and input images 701 and 702. For example, the features of the ground truth image (e.g., 701) may not match the features of the output image. To minimize the deviation, the loss gradient with respect to the weights is backpropagated through the different layers of the network (i.e. from the last layer to the first layer of the neural network).

In this manner, the localized derivative of the cost function with respect to weights at a particular layer (e.g., 15th layer output of 25 layers of the neural network) can be determined. Based on the derivative of the localized function, the weights of that particular layer (e.g., the 15th layer) may be adjusted to minimize the cost function. In order words, to minimize the deviation in the output.

The backpropagation through the deep learning model 730 may involve inverse mapping of the output tensor of a layer (e.g., 25th layer) to an input tensor of that particular layer or multiple prior layers. For example, the output tensor of a layer (e.g., 25th layer) may be inverse mapped through multiple layers to an input tensor of, e.g., 5th layer. In another example, the back propagation may involve inverse mapping of output tensor of a 25th layer with the input tensor of the 25th layer (i.e., the output of the 24th layer), the output of the 24th layer to the input tensor of the 24th layer (i.e., the output layer of the 23rd layer), and so on. At each step (i.e., at an output of a particular layer) during the backpropagation, a local derivative of the cost function may be computed. The local derivative of the cost function may be further plotted as a map (e.g., see FIG. 11) to facilitate graphically determining a direction in which to change the weights of a layer. For example, for illustrative purposes, up to 2 dimensions can be plotted. Gradient descent changes the weights such that the loss decreases. In an embodiment, one of different optimization methods, such as gradient decent, may be used to determine optimum weights so that the output tensor (e.g., the predicted image 740) accurately depicts the input image 701.

Figure 11:
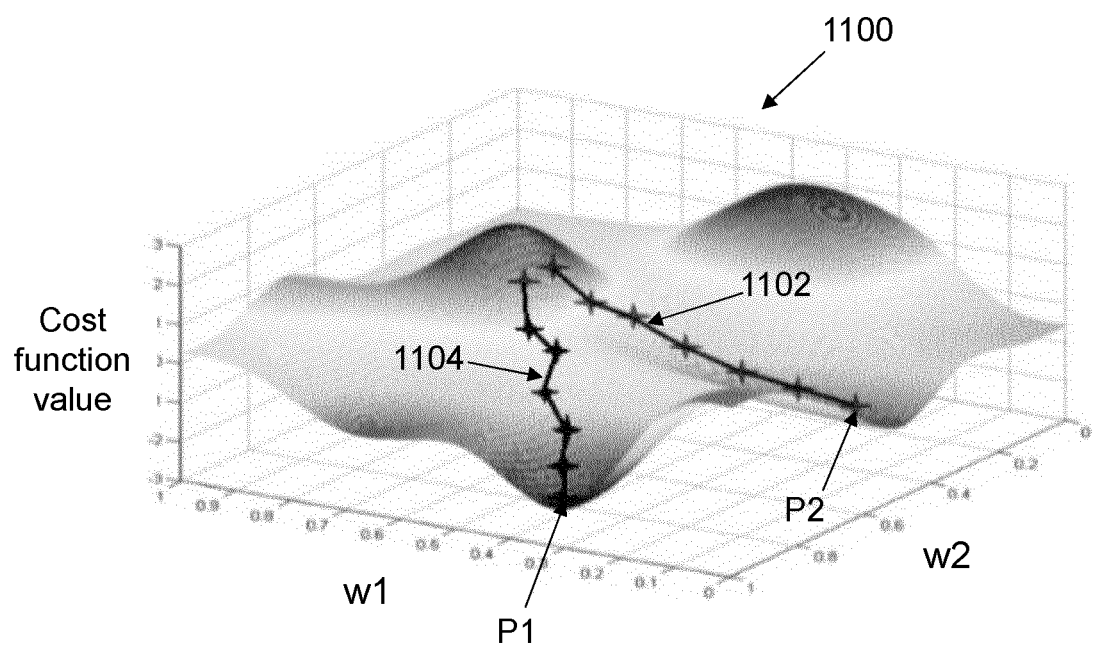
FIG. 11 is an example plot of a local derivative of a cost function, according to an embodiment.

FIG. 11 illustrates an exemplary map of the local derivatives at a particular layer, where the local derivative is taken with respect to the weights w1 and w2 of the dilation kernel in accordance with an embodiment of the present disclosure. Then, a weight may be updated based on an optimization method, for example, gradient decent method that results in more optimal weight for that particular layer that minimizes the cost given that particular layer.

In an embodiment, the cost function may be defined such that error in identifying a particular feature is reduced, preferably minimized. For example, the cost function may weigh particular features (e.g. contact holes) in the predicted image more than others resulting in more emphasis to improve the segmentation on that part. Note that different image features are represented by different classes and as such different class weights allow for feature dependent contributions to the cost function.

Figure 6:
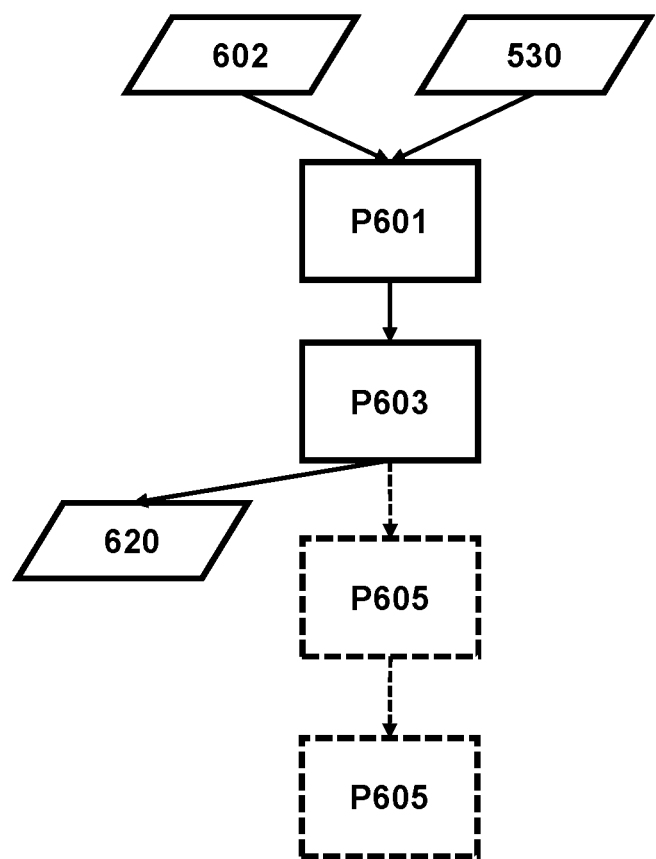
FIG. 6 is a flowchart of an example method of predicting a substrate image of the substrate based on the trained machine learning model, according to an embodiment.

FIG. 6 is a flowchart of an example method of predicting a wafer image of the wafer based on the trained machine learning model (e.g., 530/730) in accordance with an embodiment of the present disclosure. The method involves, in process P601, obtaining a mask pattern 602 of a patterning process, and the trained machine learning model (e.g., as discussed with respect to FIGS. 5 and 7).

Process P603, predicting, via the trained machine learning model 530 using the mask pattern 602 as input, the wafer image 620 that will be measured by the metrology tool. The predicted wafer image 620 resembles an image of the printed wafer captured by the metrology tool. For example, the predicted wafer image 620 mimics a SEM image captured by the SEM. As the predicted image does not include noise or distortions, such predicted image 620 can provide accurate measurement, which can be further used to optimize a patterning process or the metrology process (e.g., hot spot identification, sampling plan, measurement recipe, etc.).

The method, in process P605, further involves determining a characteristic of the printed pattern of the wafer based on the predicted wafer image. In an embodiment, the characteristic is a critical dimension, a contour of the feature, and/or an edge placement error.

The method, in process P605, further involves optimizing, based on the predicted wafer image, an aspect of the patterning process. In an embodiment, the optimizing the aspect of the patterning process involves optimizing, via a mask optimization process and the predicted mask pattern, a mask pattern of the patterning process; and/or optimizing, via a process window optimization process and the predicted mask pattern, a process window; and/or optimizing, based on the predicted mask pattern, a metrology recipe of the metrology tool.

FIG. 12A illustrates an application of an exemplary trained machine learning model (e.g., 530 or 730). The trained machine learning model 530 (or 730) receives the mask image 1210 as input and predicts a wafer image 1220. The mask image 1210 is a binary image comprising a patterns such as horizontal lines and vertical lines along with OPC. When such mask pattern (of 1210) is used for imaging on a wafer, a printed pattern is imaged on the wafer. A SEM image 1230 of an actual printed pattern is shown in FIG. 12B. Comparing the predicted wafer image 1220 and the SEM image 1230 shows that the predicted image 1220 is substantially similar to the SEM image 1230, and advantageously does not include the noise seen in SEM image 1230. Thus, the trained machine learning model can accurately predict a wafer image corresponding an input mask pattern or an image of the mask pattern.

In an embodiment, the trained machine learning model 530/730 may also predict features that were not present in a mask pattern during the training process. For example, the trained machine learning model may be trained based on mask pattern comprising lines, bar, or other features, except contact holes. However, the trained machine learning model 530/730 is capable of predicting contact holes. For example, as shown in FIG. 13A, the trained machine learning model 530/730 predicts a wafer image 1320 comprising contact holes, among other features, corresponding to contact holes of the mask pattern in the mask image 1310.

FIG. 13B is an actual SEM image 1330 of the printed wafer imaged with the mask pattern 1310. Comparing the predicted image 1320 and the actual SEM image 1330 shows that the predicted image is very similar to the SEM image, and advantageously does not include the noise seen in SEM image. Thus, the trained machine learning model can accurately predict a wafer image corresponding an input mask pattern or an image of the mask pattern, even including features that were not included in a training dataset.

In an embodiment, a noise-free predicted image (e.g., 1220 in FIG. 12A and 1320 in FIG. 13A) can have various application, including but not limited to, determining more accurate measurements of the features of the printed wafer, hot spot detection, mask pattern optimization, optimization of parameters of a patterning process, etc.

Having the model and an estimate of the model parameters, the model's output prediction may mismatch with observed reality. This can be caused by disturbances that can have various sources, such as model mismatch, parameter drift, processing apparatus offsets, etc.

So, in an embodiment, in a closed-loop system, the state of the system is adjusted such that these disturbances can be rejected. In an embodiment, there can be provided a closed-loop state estimation process.

In an embodiment, a state estimator (e.g., as provided at 430 of FIG. 4) can be configured to estimate a state $\hat{x}$ such that the predicted output $\hat{z}$ (e.g., as provided from 410 of FIG. 4 that can be a predicted SEM image by the trained machine learning model) matches a measured output (e.g., at 420 of FIG. 4 that can be an actual SEM image of a printed pattern). In an embodiment, the estimate is continually and recursively updated as further measurements of the patterning process come in; so, the estimates track the state of the system. In an embodiment, the state estimate is recursively updated using a Bayesian formulation. In other words, the state estimation is based on the latest measurements (e.g., SEM images) and the machine learning model is updated to match the predicted output with the SEM images.

Having the model (e.g., the trained machine learning model, a combination model, etc.) and its parameters and referring to FIG. 4, the model can then be used to change, design, regulate, etc. 440 a parameter/variable of the patterning process toward a target 450. For example, given the model parameters and/or the model state estimate 430, an optimization problem can be solved that determines one or more inputs 400 such that a model prediction realizes a defined target 450. In an embodiment, the optimization can utilize a model that is being regularly updated as measurements of physical structures come in. The regulation can be done in various manners. For example, in an embodiment, one or more optimal apparatus (e.g., lithographic apparatus) settings, such as focus and/or dose, are manipulated. This can be done relatively quickly and in conjunction with execution of the patterning process (e.g., between exposures or between lots of substrates). In an embodiment, one or more optimal illumination mode settings (e.g., angular or spatial distribution characteristics) can be determined. Those settings can be changed, e.g., between different lots of substrates. In an embodiment, one or more characteristics of the design pattern (e.g., addition of optical proximity features such as assist features, feature bias, serifs, etc.) can be changed. In an embodiment, the patterning process parameter comprises one or more selected from: focus, exposure dose, numerical aperture, a film stack property, projection system optical aberration, radiation coherence, illumination intensity distribution, position in an image field, and/or position on a substrate.

In an embodiment, the model can be used to identify a defect in processing of the design pattern by a patterning process. For example, the model can identify a CD that doesn't meet or cross a defined threshold. If so, the patterning process can be stopped, the substrate at issue reworked, etc.

In embodiments of the present disclosure, the model and/or model prediction system can be used for defect detection (and appropriate action in response thereto), model identification, existing model calibration, defect classification, defect estimation, process monitoring, process control, process design, design pattern design, etc.

Thus, the techniques described herein enable defect detection, model identification, existing model calibration, defect classification, defect estimation, process monitoring, process control, process design, design pattern design, etc. from review of images. In some embodiments, from such review of images, such as the individual pixels of the images as independent outcomes, a model can be created from these images for the patterning process, the model identifying, for example, the effectiveness of formation of a part of a device according to one or more patterning process parameters.

In embodiments of the present disclosure, the model may be used against measured structures of, e.g., production created patterned structures. For example, the model may be used to predict certain parameter values (e.g., particular widths) of certain structures and then one or more production created versions of the patterned structures may be measured using, for example, a scatterometer for comparison with the prediction. If the measurement and the prediction sufficiently match then the structure may be deemed "good". Otherwise, the structure may be reprocessed or scrapped. Further, the data from the comparison may be fed back into the predictive analysis (as data to establish correlations, update model parameters, etc.) and may be used to effect a change in the process (e.g., an insufficient match between the measurement and the prediction (that, for example, occurs a certain number of times) may be an indicator of a need for a change in the process).

Current computational patterning process models rely on many parameters in order to make a correct prediction. Such existing models can be complex and burdensome and can be hard to identify; as a result, they often are unable to predict product structures in production very well. They can also be too cumbersome for optimization purposes. The techniques herein can enable a relatively simple model (e.g., a logistic model) that can accurately predict physical structure formation.

Further, current approaches aim at matching simulated contours to contours extracted from images, relying on deviation of the contours to identify parameters of a model. The contouring inherently introduced inaccuracy. Further, models can be identified with measurement gauges. But, these are not the product structures per se, and so a model derived from measurement gauge can be inherently disconnected from the patterning process. The techniques evaluating pixels of images according to embodiments of the present disclosure can enable robust and accurate model parameter and/or model state estimation.

In an embodiment, pixels in an image (e.g., an electron beam or SEM image) are treated as conditionally independent of a common parameter. To this end, image data as measured by a SEM or other tool can be processed into a pixelated form (e.g., grayscale level image). A machine learning model (e.g., for a part of the patterning process, such as a lithographic model to arrive at a resist image or structure, or an etch model to arrive at a post-etch structure) is proposed that calculates the probability of a pixel being a certain level (e.g., grayscale level). As mentioned earlier, when assigning a label to a pixel (i.e. predicting it), the associated probabilities give additional information about how certain/accurate is the label assignment.

As noted above, given a measured image of a physical structure, the machine learning model can be identified as a function of one or more the descriptive features (e.g., aerial image blur, aerial image curvature) and its parameters. Using this learned model, one or more parameters (e.g., shape, CD, etc.) of a physical structure as produced by the modeled patterning process can be predicted given the design pattern.

In an embodiment, one or more known patterning process input parameters, such as focus, dose, substrate position, one or more illumination conditions, one or more etch conditions, etc. can be input to the model. Thus, the model can be used to predict the response to these process conditions.

In an embodiment, there is provided a relatively simple model that can be advantageously and quickly deployed in, e.g., a production environment. In an embodiment, the model can be recursively updated (e.g., based on measurements during production) in order to monitor and control physical structures obtained during production and consequently yield.

In an embodiment, the model can be relatively easily inverted for design pattern modification and/or other optimization problems, such as lithographic apparatus and/or etch tool regulation.

Further, in an embodiment, the model is derived from all the pixels of the complete product structure as compared to a derived contour. Since the model is identified with physical structures, the model can directly predict the behavior of the patterning process.

The term "value" can be numeric, symbolic, alphabetic, etc. data.

The term "optimize", "optimizing" and "optimization" as used herein refers to or means adjusting a patterning apparatus (e.g., a lithography apparatus), a patterning process, etc. such that results and/or processes have more desirable characteristics, such as higher accuracy of projection of a design layout on a substrate, a larger process window, etc. Thus, the term "optimizing" and "optimization" ASML used herein refers to or means a process that identifies one or more values for one or more parameters that provide an improvement, e.g. a local optimum, in at least one relevant metric, compared to an initial set of one or more values for those one or more parameters. "Optimum" and other related terms should be construed accordingly. In an embodiment, optimization steps can be applied iteratively to provide further improvements in one or more metrics.

Figure 14:
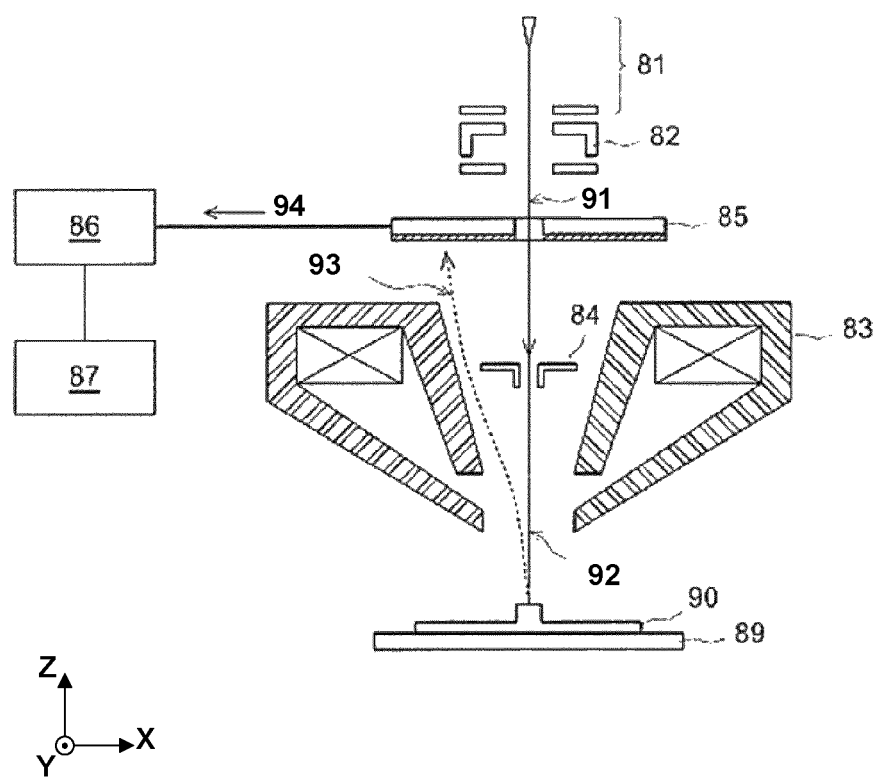
FIG. 14 schematically depicts an embodiment of an electron beam inspection apparatus, according to an embodiment.

FIG. 14 schematically illustrates a further embodiment of an inspection apparatus. The system is used to inspect a sample 90 (such as a substrate) on a sample stage 89 and comprises a charged particle beam generator 81, a condenser lens module 82, a probe forming objective lens module 83, a charged particle beam deflection module 84, a secondary charged particle detector module 85, and an image forming module 86.

The charged particle beam generator 81 generates a primary charged particle beam 91. The condenser lens module 82 condenses the generated primary charged particle beam 91. The probe forming objective lens module 83 focuses the condensed primary charged particle beam into a charged particle beam probe 92. The charged particle beam deflection module 84 scans the formed charged particle beam probe 92 across the surface of an area of interest on the sample 90 secured on the sample stage 89. In an embodiment, the charged particle beam generator 81, the condenser lens module 82 and the probe forming objective lens module 83, or their equivalent designs, alternatives or any combination thereof, together form a charged particle beam probe generator which generates the scanning charged particle beam probe 92.

The secondary charged particle detector module 85 detects secondary charged particles 93 emitted from the sample surface (maybe also along with other reflected or scattered charged particles from the sample surface) upon being bombarded by the charged particle beam probe 92 to generate a secondary charged particle detection signal 94. The image forming module 86 (e.g., a computing device) is coupled with the secondary charged particle detector module 85 to receive the secondary charged particle detection signal 94 from the secondary charged particle detector module 85 and accordingly forming at least one scanned image. In an embodiment, the secondary charged particle detector module 85 and image forming module 86, or their equivalent designs, alternatives or any combination thereof, together form an image forming apparatus which forms a scanned image from detected secondary charged particles emitted from sample 90 being bombarded by the charged particle beam probe 92.

Figure 15:
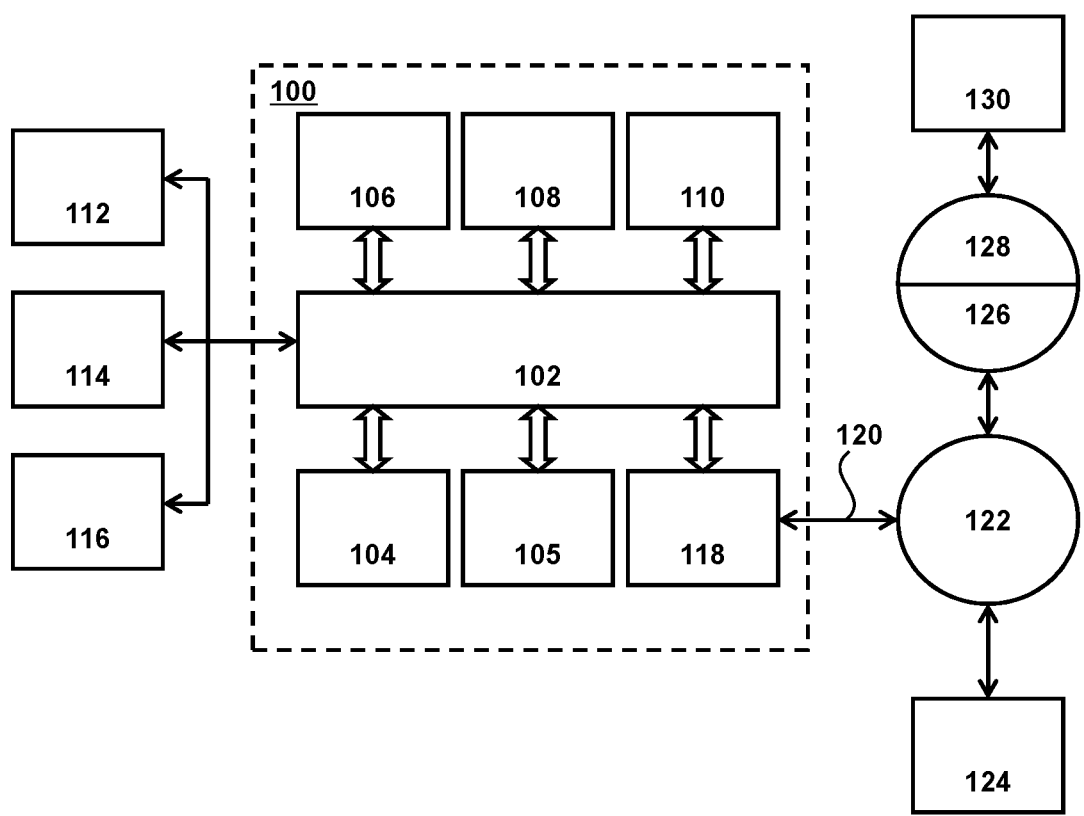
FIG. 15 is a block diagram of an example computer system, according to an embodiment.

FIG. 15 is a block diagram that illustrates a computer system 100 which can assist in implementing the optimization methods and flows disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of the optimization process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also preferably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. One such downloaded application may provide for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

Figure 16:
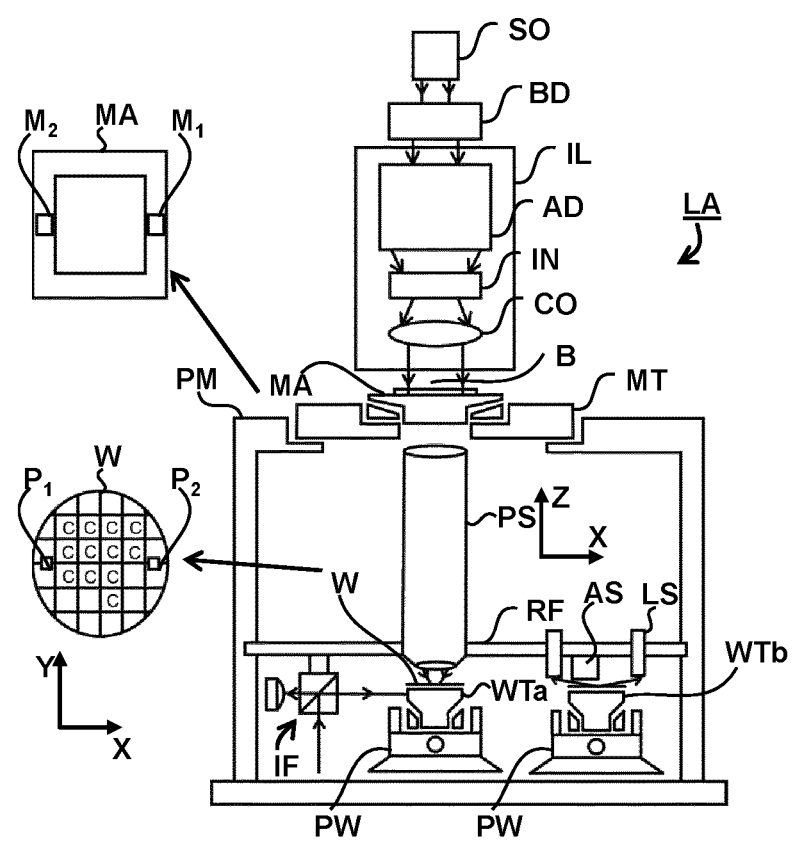
FIG. 16 is a schematic diagram of a lithographic projection apparatus, according to an embodiment.

FIG. 16 schematically depicts an exemplary lithographic projection apparatus whose illumination source could be optimized utilizing the methods described herein. The apparatus comprises:

1. an illumination system IL, to condition a beam B of radiation. In this particular case, the illumination system also comprises a radiation source SO;
2. a first object table (e.g., mask table) MT provided with a patterning device holder to hold a patterning device MA (e.g., a reticle), and connected to a first positioner to accurately position the patterning device with respect to item PS;
3. a second object table (substrate table) WT provided with a substrate holder to hold a substrate W (e.g., a resist coated silicon wafer), and connected to a second positioner to accurately position the substrate with respect to item PS;
4. a projection system ("lens") PS (e.g., a refractive, catoptric or catadioptric optical system) to image an irradiated portion of the patterning device MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning device as an alternative to the use of a classic mask; examples include a programmable mirror array or LCD matrix.

The source SO (e.g., a mercury lamp or excimer laser) produces a beam of radiation. This beam is fed into an illumination system (illuminator) IL, either directly or after having traversed conditioning means, such as a beam expander Ex, for example. The illuminator IL may comprise adjusting means AD for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam B impinging on the patterning device MA has a desired uniformity and intensity distribution in its cross section.

It should be noted with regard to FIG. 16 that the source SO may be within the housing of the lithographic projection apparatus (as is often the case when the source SO is a mercury lamp, for example), but that it may also be remote from the lithographic projection apparatus, the radiation beam that it produces being led into the apparatus (e.g., with the aid of suitable directing mirrors); this latter scenario is often the case when the source SO is an excimer laser (e.g., based on KrF, ArF or F2 lasing).

The beam PB subsequently intercepts the patterning device MA, which is held on a patterning device table MT. Having traversed the patterning device MA, the beam B passes through the lens PL, which focuses the beam B onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the patterning device MA with respect to the path of the beam B, e.g., after mechanical retrieval of the patterning device MA from a patterning device library, or during a scan. In general, movement of the object tables MT, WT will be realized with the aid of a long-stroke module (coarse positioning) and a short-stroke module (fine positioning), which are not explicitly depicted in FIG. 16. However, in the case of a wafer stepper (as opposed to a step-and-scan tool) the patterning device table MT may just be connected to a short stroke actuator, or may be fixed.

The depicted tool can be used in two different modes:

In step mode, the patterning device table MT is kept essentially stationary, and an entire patterning device image is projected in one go (i.e., a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the patterning device table MT is movable in a given direction (the so-called "scan direction", e.g., the y direction) with a speed v, so that the projection beam B is caused to scan over a patterning device image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 17:
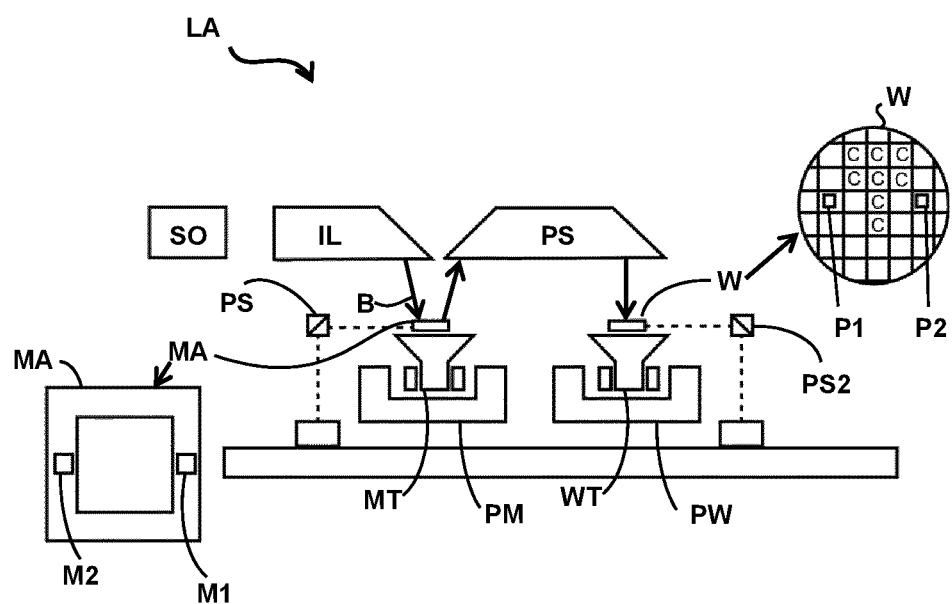
FIG. 17 is a schematic diagram of another lithographic projection apparatus, according to an embodiment.

FIG. 17 schematically depicts another exemplary lithographic projection apparatus LA whose illumination source could be optimized utilizing the methods described herein.

The lithographic projection apparatus LA includes:
a source collector module SO
an illumination system (illuminator) IL configured to condition a radiation beam B (e.g. EUV radiation).
a support structure (e.g. a mask table) MT constructed to support a patterning device (e.g. a mask or a reticle) MA and connected to a first positioner PM configured to accurately position the patterning device;
a substrate table (e.g. a wafer table) WT constructed to hold a substrate (e.g. a resist coated wafer) W and connected to a second positioner PW configured to accurately position the substrate; and
a projection system (e.g. a reflective projection system) PS configured to project a pattern imparted to the radiation beam B by patterning device MA onto a target portion C (e.g. comprising one or more dies) of the substrate W.

As here depicted, the apparatus LA is of a reflective type (e.g. employing a reflective mask). It is to be noted that because most materials are absorptive within the EUV wavelength range, the mask may have multilayer reflectors comprising, for example, a multi-stack of Molybdenum and Silicon. In one example, the multi-stack reflector has a 40 layer pairs of Molybdenum and Silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Referring to FIG. 17, the illuminator IL receives an extreme ultra violet radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 17, for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus LA could be used in at least one of the following modes:

In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-magnification and image reversal characteristics of the projection system PS.

In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 18:
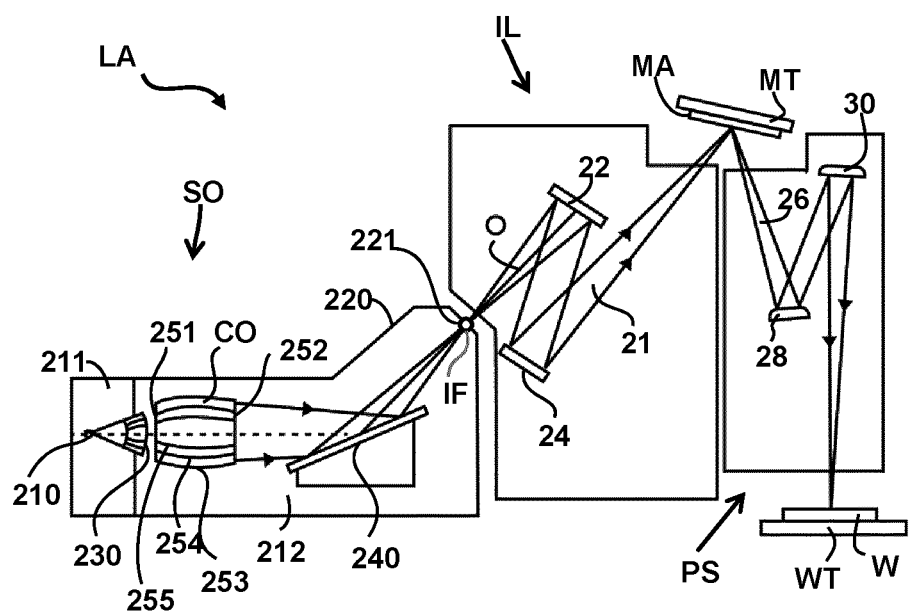
FIG. 18 is a more detailed view of the apparatus in FIG. 17, according to an embodiment.

FIG. 18 shows the apparatus LA in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the figures, for example there may be 1-6 additional reflective elements present in the projection system PS than shown in FIG. 18.

Collector optic CO, as illustrated in FIG. 18, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type is preferably used in combination with a discharge produced plasma source, often called a DPP source.

Figure 19:
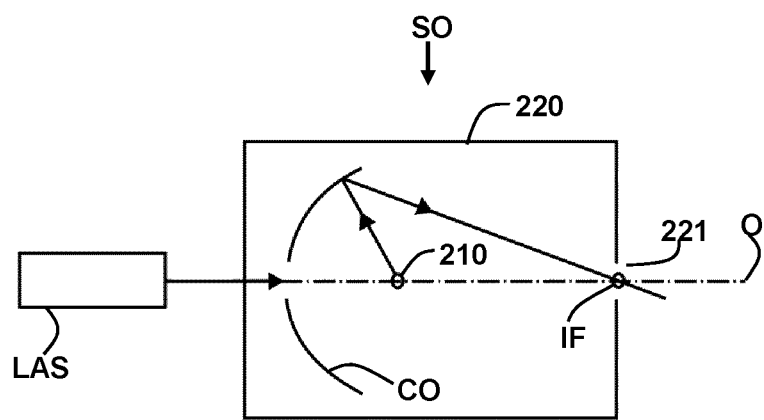
FIG. 19 is a more detailed view of the source collector module SO of the apparatus of FIGS. 17 and 18, according to an embodiment.

Alternatively, the source collector module SO may be part of an LPP radiation system as shown in FIG. 19. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

The concepts disclosed herein may simulate or mathematically model any generic imaging system for imaging sub wavelength features, and may be especially useful with emerging imaging technologies capable of producing increasingly shorter wavelengths. Emerging technologies already in use include EUV (extreme ultra violet), DUV lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

The embodiments may further be described using the following clauses:

1. A method for training a machine learning model configured to predict a substrate image corresponding to a printed pattern of a substrate as measured via a metrology tool, the method comprising:
   obtaining a training data set comprising (i) metrology data of the metrology tool used to measure the printed pattern of the substrate, and (ii) a mask pattern employed for imaging the printed pattern on the substrate; and
   training, based on the training data set, a machine learning model to predict the substrate image of the substrate as measured by the metrology tool such that a cost function is improved,
   wherein the cost function comprises a relationship between the predicted substrate image and the metrology data.

2. The method of clause 1, wherein the metrology data comprises:
   an image of the printed pattern on the substrate captured via the metrology tool; and/or
   metrology recipe of the metrology tool used during measurements of the printed pattern on the substrate.

3. The method of clause 2, wherein the metrology tool is a scanning electron microscope and the image is a scanning electron microscope image.

4. The method of clause 2, wherein the metrology tool is the scanning electron microscope and the metrology recipe includes one or more parameters of the scanning electron microscope.

5. The method of clause 4, wherein the one or more parameters of the scanning electron microscope are at least one of:
   an e-beam intensity;
   an angle of incidence; or
   a sampling location information.

6. The method of any of the clauses 1-5, wherein the predicted image of the machine learning model is a segmented image.

7. The method of clause 6, wherein the segmented image comprises a plurality of class labels are assigned to features of the printed pattern.

8. The method of clause 7, wherein the predicted image is a pixelated image, wherein each pixel is assigned a class label of the plurality of class labels based on a probability of the pixel belonging to a particular class of the plurality of class labels.

9. The method of any of clauses 5-7, wherein each class label of the plurality of class label correspond to a grayscale level.

10. The method of clause 9, wherein the grayscale level is a grouping of a range of grayscale values.

11. The method of clause 10, wherein the grouping of the grayscale values based on:
   uniform grouping;
   pixels corresponding a particular feature of the printed pattern; and/or
   weighted pixel grouping.

12. The method of any of clauses 1-11, wherein the machine learning model is a convolutional neural network.

13. The method of clause 12, wherein the training of the machine learning model is an iterative process, an iteration comprising:
   determining values of model parameters of the convolutional neural network based on the metrology data and the mask pattern; and
   adjusting the values of the model parameters until the cost function of the convolutional neural network is improved.

14. The method of any of clauses 1-13, wherein the cost function of is a generalized dice loss.

15. The method of clause 1-14, the adjusting the values of the model parameters is such that the generalized dice loss is reduced.

16. The method of any of clauses 1-15, further comprising:
   determining a characteristic of the printed pattern of the substrate based on the predicted substrate image.

17. The method of clause 16, wherein the characteristic is a critical dimension, a contour of the feature, and/or an edge placement error.

18. The method of any of clauses 1-17, wherein the training data further comprises:
   values of one or more parameters of the patterning process.

19. The method of clause 17, wherein the one or more parameters of the patterning process include at least one of dose, focus, intensity, or illumination mode.

20. The method of any of clauses 13-18, further comprising:
   acquiring, via the metrology tool, real time metrology data during or just after the patterning process,
   updating the trained machine learning model based on the real-time metrology data and the mask pattern used during the patterning process.

21. A method to predict a substrate image corresponding to a printed pattern of a substrate, the method comprising:
   obtaining a mask pattern of a patterning process, and a trained machine learning model; and
   predicting, via the trained machine learning model using the mask pattern as input, the substrate image that will be measured by a metrology tool.

22. The method of clause 21, further comprising:
determining a characteristic of the printed pattern of the substrate based on the predicted substrate image.

23. The method of clause 22, the characteristic is a critical dimension, a contour of the feature, and/or an edge placement error.

24. The method of any of clauses 21-23, further comprising:
optimizing, based on the predicted substrate image, an aspect of the patterning process.

25. The method of clause 21, wherein the optimizing the aspect of the patterning process comprises:
optimizing, via a mask optimization process and the predicted mask pattern, a mask pattern of the patterning process; and/or
optimizing, via a process window optimization process and the predicted mask pattern, a process window;
optimizing, based on the predicted mask pattern, a metrology recipe of the metrology tool.

26. A computer program product comprising a non-transitory computer readable medium having instructions recorded thereon, the instructions when executed by a computer implementing the method of any of the above clauses.

27. The method or computer program product of any of clauses 1-26, wherein the predicted substrate image is substantially free of noise compared with an actual substrate image as measured by the metrology tool.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The descriptions above are intended to be illustrative, not limiting. Thus, it will be apparent to one skilled in the art that modifications may be made as described without departing from the scope of the claims set out below.

What is claimed is:

1. A computer program product comprising a non-transitory computer readable medium having instructions therein, the instructions, when executed by a computer system, configured to cause the computer system to at least:
obtain a training data set comprising (i) metrology data of a metrology tool used to measure a printed pattern of a substrate, and (ii) a representation of a mask pattern employed for imaging the printed pattern on the substrate; and
train, based on the training data set, a machine learning model operable to predict a substrate image of the substrate as measured by the metrology tool based on a cost function, wherein the substrate image corresponds to the printed pattern of the substrate as measured via the metrology tool,
wherein the predicted substrate image that is produced by the machine learning model comprises a segmented image.

2. The computer program product of claim 1, wherein the metrology data comprises:
an image of the printed pattern on the substrate captured via the metrology tool; and/or
a metrology recipe of the metrology tool used during measurement of the printed pattern on the substrate.

3. The computer program product of claim 2, wherein the metrology tool is a scanning electron microscope and the image is a scanning electron microscope image, wherein the metrology data comprising the metrology recipe, and wherein the metrology recipe of the scanning electron microscope comprises at least one selected from:
an e-beam intensity;
an angle of incidence; and/or
sampling location information.

4. The computer program product of claim 1, wherein the segmented image is associated with a plurality of class labels assigned to features of the printed pattern.

5. The computer program product of claim 4, wherein the predicted image is a pixelated image, and wherein each pixel is assigned a class label of the plurality of class labels based on a probability of the pixel belonging to a particular class of the plurality of class labels.

6. The computer program product of claim 4, wherein each class label of the plurality of class label correspond to a grayscale level that comprises one or more grayscale values.

7. The computer program product of claim 6, wherein the one or more grayscale values are grouped to the grayscale level based on:
uniform grouping;
pixels corresponding a particular feature of the printed pattern; and/or
weighted pixel grouping.

8. The computer program product of claim 1, wherein the machine learning model is a convolutional neural network, and wherein the training of the machine learning model comprises an iterative process, an iteration of the iterative process comprising:
determination of values of model parameters of the convolutional neural network based on the metrology data and the representation of the mask pattern; and
adjustment of the values of the model parameters to improve the cost function of the convolutional neural network.

9. The computer program product of claim 1, wherein the instructions are further configured to cause the computer system to determine a characteristic of the printed pattern of the substrate based on the predicted substrate image, wherein the characteristic comprises a critical dimension, a contour of a feature, and/or an edge placement error.

10. The computer program product of claim 1, wherein the training data further comprises values of one or more parameters of a patterning process, and wherein the one or more parameters of the patterning process include at least one selected from: of dose, focus, intensity, or illumination mode.

11. The computer program product of claim 1, wherein the instructions are further configured to cause the computer system to:
acquire, via the metrology tool, additional metrology data during or after the patterning process; and
update the trained machine learning model based on the additional metrology data and/or a representation of the mask pattern used during the patterning process.

12. The computer program product of claim 1, wherein the instructions are further configured to cause the computer system to:
obtain a representation of another mask pattern of a patterning process, and the trained machine learning model; and
predict, via the trained machine learning model using the representation of the another mask pattern as input, another substrate image resulting from the metrology tool.

13. The computer program product of claim 1, wherein the instructions are further configured to cause the computer system to:

optimize, based on the predicted substrate image, an aspect of the patterning process, wherein the optimization of the aspect of the patterning process comprises one or more selected from:
    optimization of, via a mask optimization process, a mask pattern of the patterning process;
    optimization of, via a process window optimization process, a process window; and/or
    optimization of a metrology recipe of the metrology tool.

14. The computer program product of claim 1, wherein the cost function comprises a relationship between the predicted substrate image and the metrology data.

15. The computer program product of claim 1, wherein the predicted substrate image is substantially free of noise compared with an actual substrate image as measured by the metrology tool.

16. A method comprising:
    obtaining a training data set comprising (i) metrology data of a metrology tool used to measure a printed pattern of a substrate, and (ii) a representation of a mask pattern employed for imaging the printed pattern on the substrate; and
    training, based on the training data set, a machine learning model operable to predict a substrate image of the substrate as measured by the metrology tool based on a cost function, wherein the substrate image corresponds to the printed pattern of the substrate as measured via the metrology tool,
    wherein the predicted substrate image that is produced by the machine learning model comprises a segmented image.

17. The method of claim 16, wherein the metrology data comprises:
    an image of the printed pattern on the substrate captured via the metrology tool; and/or
    a metrology recipe of the metrology tool used during measurement of the printed pattern on the substrate.

18. The method of claim 16, wherein the segmented image is associated with a plurality of class labels assigned to features of the printed pattern.

19. A method comprising:
    obtaining a training data set comprising (i) metrology data of a metrology tool used to measure a printed pattern of a substrate, and (ii) a representation of a mask pattern employed for imaging the printed pattern on the substrate; and
    training, based on the training data set, a machine learning model operable to predict a substrate image of the substrate as measured by the metrology tool based on a cost function, wherein the substrate image corresponds to the printed pattern of the substrate as measured via the metrology tool,
    wherein the cost function comprises a relationship between the predicted substrate image and the metrology data.

20. The method of claim 19, wherein the predicted substrate image is substantially free of noise compared with an actual substrate image as measured by the metrology tool.

* * * * *